(12) United States Patent
Numazaki

(10) Patent No.: US 9,564,388 B2
(45) Date of Patent: Feb. 7, 2017

(54) SEMICONDUCTOR DEVICE HAVING A PLURALITY OF CIRCUITS ARRANGED ON A SIDE OF A SEMICONDUCTOR CHIP

(71) Applicant: RENESAS ELECTRONICS CORPORATION, Tokyo (JP)

(72) Inventor: Masato Numazaki, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 14/972,369

(22) Filed: Dec. 17, 2015

(65) Prior Publication Data

US 2016/0104664 A1 Apr. 14, 2016

Related U.S. Application Data

(63) Continuation of application No. 14/449,231, filed on Aug. 1, 2014, now Pat. No. 9,236,333, which is a
(Continued)

(30) Foreign Application Priority Data

Mar. 15, 2011 (JP) .................................. 2011-056073

(51) Int. Cl.
*H01L 23/495* (2006.01)
*H01L 23/00* (2006.01)
(Continued)

(52) U.S. Cl.
CPC ....... *H01L 23/49541* (2013.01); *H01L 21/565* (2013.01); *H01L 23/4952* (2013.01);
(Continued)

(58) Field of Classification Search
CPC ............ H01L 2224/48227; H01L 2224/73265; H01L 23/4952; H01L 23/49838; H01L 23/5389; H01L 23/3107; H01L 23/49524; H01L 23/481; H01L 23/49555; H01L 23/49531; H01L 23/49503; H01L 21/565; H01L 24/49; H01L 2224/48247; H01L 23/49541; H01L 24/85; H01L 24/97; H01L 2224/48135; H01L 2224/48137; H01L 2224/48465
See application file for complete search history.

(56) References Cited

U.S. PATENT DOCUMENTS

| 5,793,099 A * | 8/1998 | Murakami .......... H01L 23/3107 257/666 |
| 5,831,421 A | 11/1998 | Taira et al. |

(Continued)

FOREIGN PATENT DOCUMENTS

| JP | 9-289288 | 11/1997 |
| JP | 2004356382 | 12/2004 |
| JP | 2010177510 | 8/2010 |

OTHER PUBLICATIONS

JP Office Action in JP App. No. 2011-056073, dated Jun. 3, 2014.
(Continued)

*Primary Examiner* — Mohsen Ahmadi
(74) *Attorney, Agent, or Firm* — Mattingly & Malur, PC

(57) ABSTRACT

A semiconductor device includes a base member and a first semiconductor chip mounted over the base member. The first semiconductor chip including a first circuit, a second circuit, and a third circuit arranged between the first circuit and the second circuit and a plurality of pads. The first, second and third circuits are arranged along a first side of the first semiconductor chip. In plan view, the pads are located outside of the circuits and include a plurality of first pads arranged at a first pitch, and a plurality of second pads arranged at the first pitch. A distance between a first pad group comprised of the first pads and a second pad group comprised of the second pads is larger than the first pitch.
(Continued)

Further, in a plan view, a part of the third circuit is located between the first pad group and the second pad group.

6 Claims, 24 Drawing Sheets

Related U.S. Application Data continuation of application No. 13/368,560, filed on Feb. 8, 2012, now Pat. No. 8,828,805.

(51) Int. Cl.
*H01L 21/56* (2006.01)
*H01L 23/31* (2006.01)

(52) U.S. Cl.
CPC .. *H01L 23/49503* (2013.01); *H01L 23/49524* (2013.01); *H01L 23/49575* (2013.01); *H01L 24/49* (2013.01); *H01L 24/85* (2013.01); *H01L 24/97* (2013.01); H01L 23/3107 (2013.01); H01L 24/45 (2013.01); H01L 24/48 (2013.01); H01L 24/78 (2013.01); H01L 2223/54486 (2013.01); H01L 2224/05554 (2013.01); H01L 2224/45144 (2013.01); H01L 2224/48091 (2013.01); H01L 2224/48095 (2013.01); H01L 2224/48137 (2013.01); H01L 2224/48247 (2013.01); H01L 2224/48465 (2013.01); H01L 2224/48479 (2013.01); H01L 2224/49175 (2013.01); H01L 2224/78301 (2013.01); H01L 2224/85051 (2013.01); H01L 2224/85986 (2013.01); H01L 2224/97 (2013.01); H01L 2924/01005 (2013.01); H01L 2924/01006 (2013.01); H01L 2924/01033 (2013.01); H01L 2924/01047 (2013.01); H01L 2924/01079 (2013.01); H01L 2924/01082 (2013.01); H01L 2924/12042 (2013.01); H01L 2924/1306 (2013.01); H01L 2924/181 (2013.01)

(56) References Cited

U.S. PATENT DOCUMENTS

| | | | |
|---|---|---|---|
| 6,303,948 B1 * | 10/2001 | Kudou | H01L 23/4951 257/207 |
| 6,583,511 B2 | 6/2003 | Michii et al. | |
| 7,879,655 B2 * | 2/2011 | Tsutsumi | H01L 23/49838 257/E23.039 |
| 8,178,975 B2 | 5/2012 | Yang et al. | |
| 8,237,267 B2 | 8/2012 | Shinohara | |
| 8,466,540 B2 | 6/2013 | Tanaka et al. | |
| 8,648,339 B2 | 2/2014 | Koyama et al. | |
| 8,946,705 B2 * | 2/2015 | Yasumura | H01L 24/05 257/48 |
| 2003/0209815 A1 * | 11/2003 | Ito | H01L 21/4828 257/797 |
| 2009/0057851 A1 | 3/2009 | Kaneda | |
| 2010/0006992 A1 * | 1/2010 | Dirks | H01L 23/3107 257/676 |
| 2010/0193923 A1 | 8/2010 | Tanaka et al. | |
| 2010/0193924 A1 * | 8/2010 | Goto | H01L 23/4951 257/676 |
| 2011/0057299 A1 * | 3/2011 | Takata | B23K 20/007 257/676 |
| 2011/0089563 A1 * | 4/2011 | Kikuchi | H01L 21/565 257/738 |
| 2011/0248406 A1 * | 10/2011 | Wada | H01L 24/03 257/773 |
| 2012/0052628 A1 | 3/2012 | Kuroda | |

OTHER PUBLICATIONS

Chinese Office Action received in corresponding Chinese Application No. 201210063525.0 dated Sep. 28, 2015.

Japanese Office Action received in corresponding Japanese Application No. 2014-154313 dated Jun. 9, 2015.

* cited by examiner

SEMICONDUCTOR DEVICE HAVING A PLURALITY OF CIRCUITS ARRANGED ON A SIDE OF A SEMICONDUCTOR CHIP

CROSS-REFERENCE TO RELATED APPLICATIONS

This is a continuation application of U.S. Ser. No. 14/449,231, filed Aug. 1, 2014, which is a continuation application of of U.S. Ser. No. 13/368,560, filed Feb. 8, 2012 which claims priority to Japanese Patent Application No. 2011-56073 filed on Mar. 15, 2011. The entire disclosures of all of these applications are hereby incorporated by reference.

BACKGROUND

The present invention relates to manufacturing technologies of semiconductor devices and in particular to a technology effectively applicable to a semiconductor device formed by planarly arranging multiple semiconductor chips.

For example, Japanese Unexamined Patent Publication No. 2004-356382 (Patent Document 1) discloses the structure of a semiconductor integrated circuit device (semiconductor device) formed by planarly arranging multiple semiconductor chips. The structure disclosed in Patent Document 1 is such that: in wire-bonded semiconductor chips A and B, the thickness of the semiconductor chip A on the ball bond side is made larger than the thickness of the semiconductor chip B on the stitch bond side.

[Patent Document 1]
Japanese Unexamined Patent Publication No. 2004-356382

SUMMARY

In recent years, various types of semiconductor devices with multiple semiconductor chips incorporated therein have been developed. Among them, there are semiconductor devices in which multiple semiconductor chips are mounted and placed (plane configuration) over a single placement portion (die pad) as in, for example, Patent Document 1.

The present inventors considered further reducing the outer dimensions of such a semiconductor device.

To reduce the outer dimensions of such a semiconductor device as mentioned above, for example, the following measure could be used: the distance between semiconductor chips adjoining to each other is reduced and the outer dimensions of the chip placement portion are thereby reduced.

However, it is necessary to take the following measure when multiple semiconductor chips are mounted over one chip placement portion as described in Patent Document 1: it is necessary to accurately carryout alignment so that a semiconductor chip mounted first does not overlap with an area (chip placement area) for a semiconductor chip mounted later.

FIG. 27 is a plan view illustrating the structure of a semiconductor device (semiconductor package 50) in a comparative example investigated by the present inventors for the purpose of comparison. In the semiconductor package 50, two semiconductor chips 51, 52 are mounted side by side and mounted over one die pad (chip placement portion) 53 with a plane configuration. Multiple leads 54 are arranged around the two semiconductor chips 51, 52 and each of the semiconductor chips 51, 52 are electrically connected with multiple leads 54 via a conductive wire 56. The die pad 53 is supported by suspending leads 55 and the die pad 53, the semiconductor chips 51, 52, and part of the wires 56 and the leads 54 are sealed with a sealing body 57 formed of resin.

As a technique for carrying out the above alignment by the discrimination of the respective chip placement areas of the semiconductor chips 51, 52 in the assembly of the semiconductor package 50, for example, the following is possible: a slit (through hole) 53a is provided between the chip placement areas adjoining to each other of the die pad 53 and the respective chip placement areas are discriminated (recognized) using this slit 53a as a marker.

When the slit 53a is applied, however, an area in certain size for forming the slit 53a is required with the accuracy of processing the slit 53a taken into account. This makes it difficult to sufficiently reduce the distance between the semiconductor chips 51, 52 adjoining to each other. That is, it is difficult to reduce the outer dimensions of the die pad 53 as the chip placement portions.

Consequently, the present inventors examined a structure in which semiconductor chips are aligned using a technique other than slit and the distance between the semiconductor chips adjoining to each other is made smaller (for example, than in Patent Document 1). As a result, the present inventors found a problem that a void (resin unfilled failure) was produced between the semiconductor chips adjoining to each other at a resin sealing step (molding step) after the semiconductor chips were mounted.

The cause of this problem may be attributed to that at the resin sealing step, resin was supplied from the side of one semiconductor chip toward the side of the other semiconductor chip and the resin was not sufficiently filled between the semiconductor chips.

The invention was made in consideration of the above problem and it is an object thereof to provide a technology with which the formation of a void can be suppressed.

It is another object of the invention to provide a technology with which reduction of the size of a semiconductor device can be achieved.

The above and other objects and novel features of the invention will be apparent from the description in this specification and the accompanying drawings.

The following is a brief description of the gist of the representative elements of the invention laid open in this application:

A manufacturing method of a semiconductor device in a representative embodiment includes the steps of: (a) providing a lead frame including a die pad comprised of a quadrangle having a pair of first sides opposed to each other and a pair of second sides intersecting with the first sides and opposed to each other, a first lead group arranged along one of the two first sides of the die pad in the plan view, a second lead group arranged along the other of the two first sides of the die pad in the plan view, and suspending leads connecting to the second sides of the die pad; (b) mounting a first semiconductor chip having a first front surface, multiple first bonding pads formed on the first front surface, and a first back surface opposite to the first front surface, in a first area of the die pad and placing a second semiconductor chip having a second front surface, multiple second bonding pads formed on the second front surface, and a second back surface opposite to the second front surface, in a second area of the die pad positioned next to the first area in the plan view; (c) respectively electrically connecting multiple external bonding pads of the first bonding pads and multiple external bonding pads of the second bonding pads with the first lead group and the second lead group via multiple external wires and respectively electrically connecting multiple internal bonding pads of the first bonding pads with multiple internal bonding pads of the second bonding pads via multiple internal wires; and (d) supplying resin from one side to the other side of the second sides of the die pad, and sealing the die pad, first semiconductor chip, second semiconductor chip, external wires, and internal wires with the resin.

The second area is positioned between the first area and the other of the two second sides of the die pad in the plan view.

The internal bonding pads of the first semiconductor chip include a first pad group and a second pad group.

The internal bonding pads of the second semiconductor chip include a third pad group and a fourth pad group.

The internal wires include multiple first internal wires for electrically connecting the first pad group with the third pad group and multiple second internal wires for electrically connecting the second pad group with the fourth pad group.

The distance between the first pad group and the second pad group is longer than the distance between the third pad group and the fourth pad group; and the distance between the first pad group and the second pad group is longer than the length equivalent to multiple ones of the internal bonding pads.

The following is a brief description of the gist of the effects obtained by the representative elements of the invention laid open in this application:

The formation of a void can be suppressed in the assembly of a semiconductor device.

Reduction of the size of a semiconductor device can be achieved.

BRIEF DESCRIPTION OF THE DRAWINGS

FIG. 1 is a plan view illustrating an example of the structure of a semiconductor device in an embodiment of the invention with a sealing body seen through;

FIG. 22 is a plan view illustrating the structure of a semiconductor device in a first modification to the embodiment of the invention with a sealing body seen through;

FIG. 23 is a plan view illustrating the structure of a semiconductor device in a second modification to the embodiment of the invention with a sealing body seen through;

FIG. 27 is a plan view illustrating the structure of a semiconductor device in a comparative example with a sealing body seen through.

DETAILED DESCRIPTION

Figure 1:
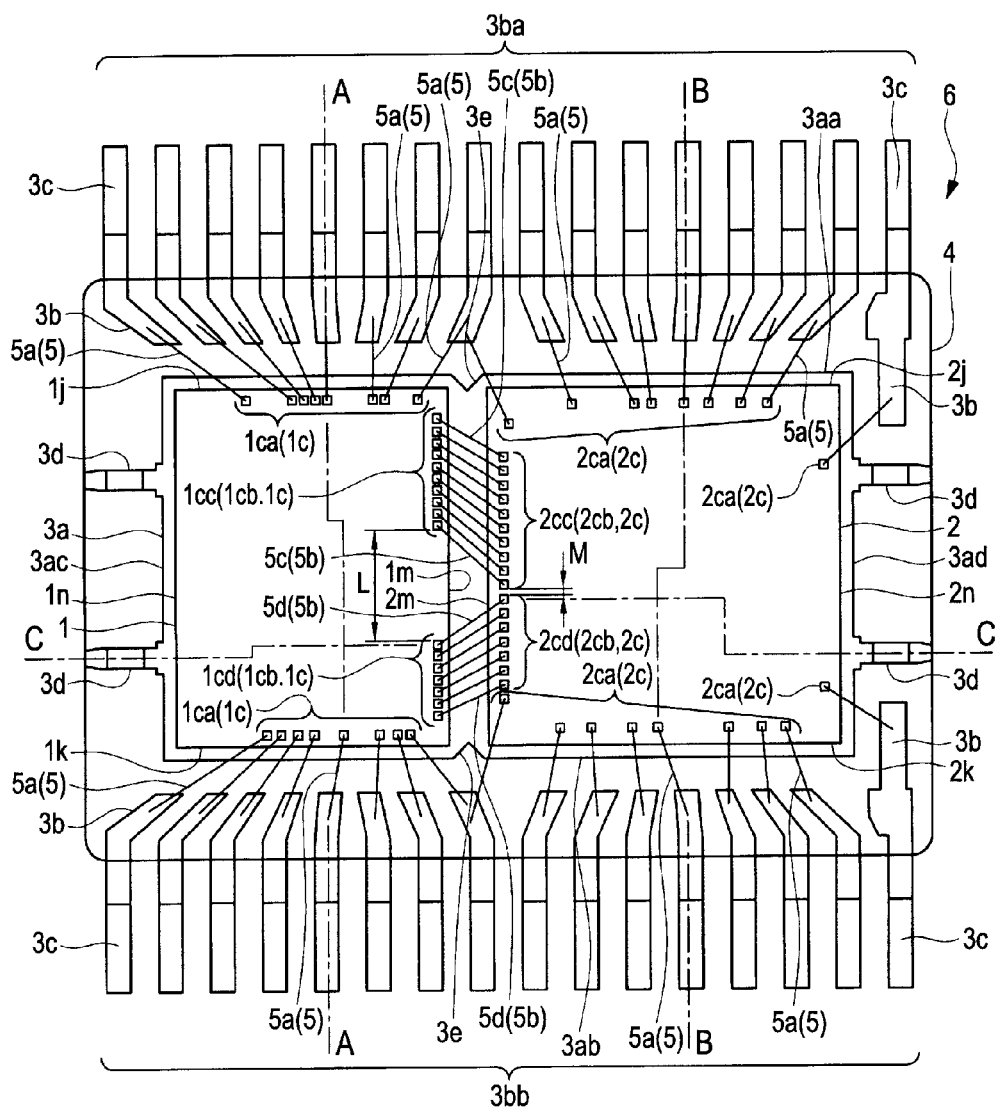

In the following description of an embodiment, the explanation of an identical or a similar part will not be repeated as a rule unless necessary.

The following description of the embodiment will be divided into multiple sections if necessary for the sake of convenience. Unless explicitly stated otherwise, they are not unrelated to one another and they are in such a relation that one is a modification, details, supplementary explanation, or the like of part or all of the other.

When mention is made of any number of elements (including a number of pieces, a numeric value, a quantity, a range, and the like) in the following description of the embodiment, the number is not limited to that specific number. Unless explicitly stated otherwise or the number is obviously limited to a specific number in principle, the foregoing applies and the number may be above or below that specific number.

In the following description of the embodiment, needless to add, its constituent elements (including elemental steps and the like) are not always indispensable unless explicitly stated otherwise or they are obviously indispensable in principle.

When the wording of "formed of A," "made up of A," "having A," or "including A" is used with respect to a constituent element or the like in the following description of the embodiment, needless to add, the other elements are not excluded. This applies unless it is especially and explicitly stated that only that element is included. Similarly, when mention is made of the shape, positional relation, or the like of a constituent element or the like in the following description of the embodiment, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

Hereafter, detailed description will be given to an embodiment of the invention with reference to the drawings. In all the drawings for explaining the embodiment, members having the same functions will be marked with the same reference numerals and the repetitive description thereof will be omitted.

Embodiment

Figure 2:
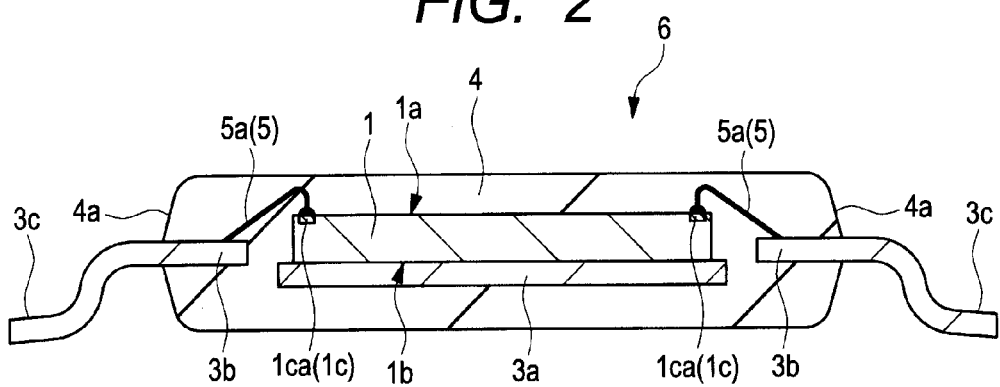
FIG. 2 is a sectional view illustrating an example of the structure obtained by cutting the semiconductor device along line A-A of FIG. 1.
Figure 3:
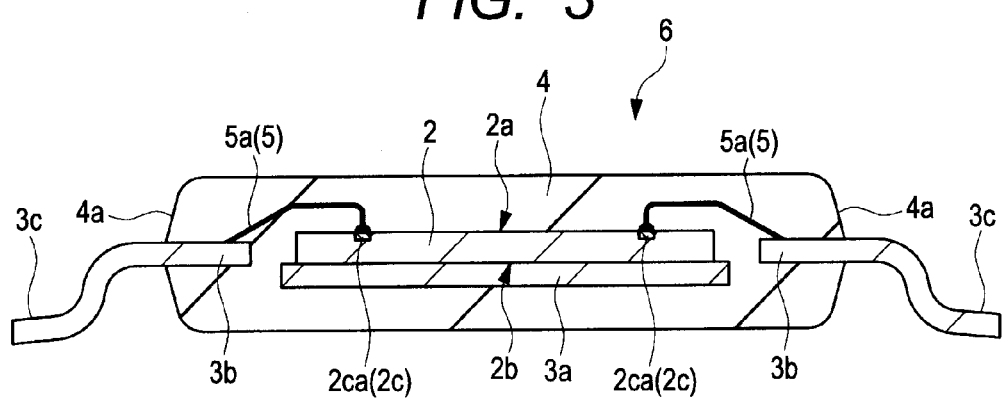
FIG. 3 is a sectional view illustrating an example of the structure obtained by cutting the semiconductor device along line B-B of FIG. 1.
Figure 4:
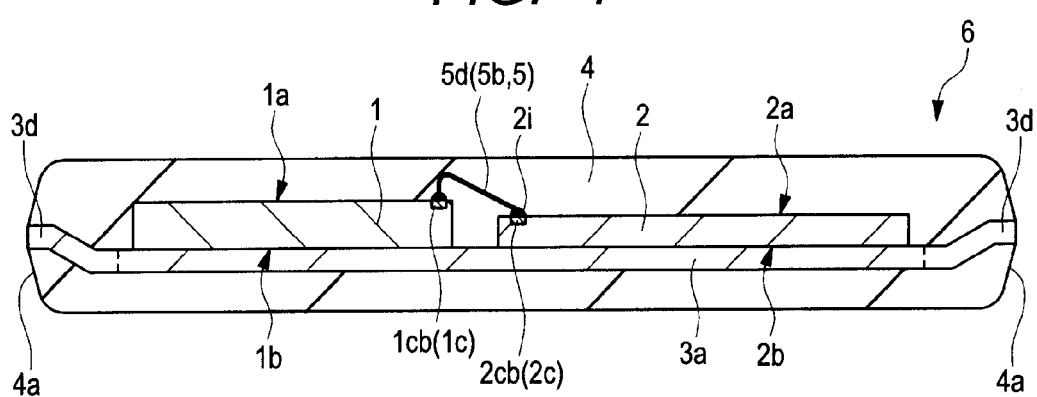
FIG. 4 is a sectional view illustrating an example of the structure obtained by cutting the semiconductor device along line C-C of FIG. 1.
Figure 5:
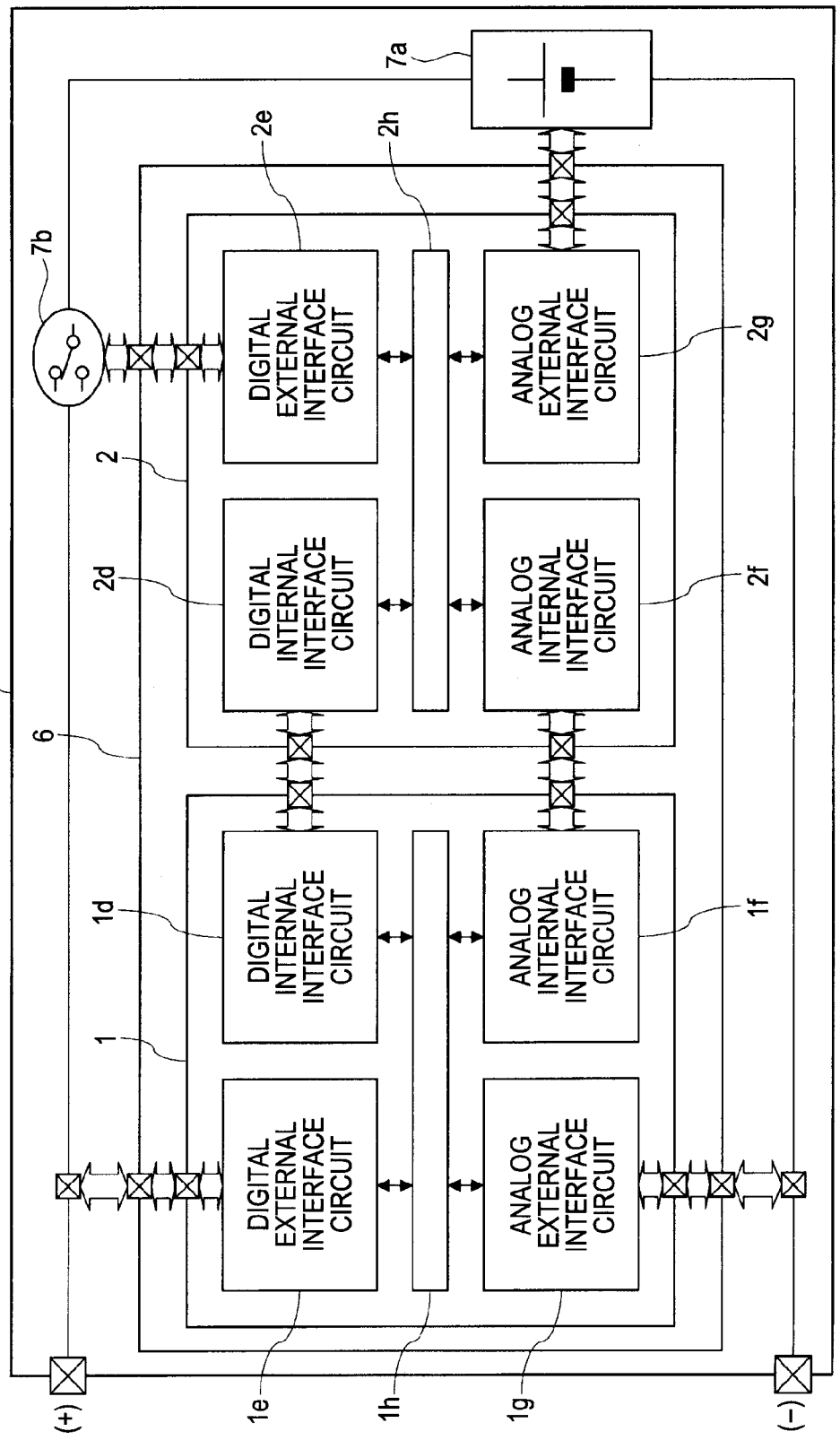
FIG. 5 is a circuit block diagram illustrating an example of the system configuration of the semiconductor device in FIG. 1.

FIG. 1 is a plan view illustrating an example of the structure of a semiconductor device in the embodiment of the invention with a sealing body seen through; FIG. 2 is a sectional view illustrating an example of the structure obtained by cutting the semiconductor device along line A-A of FIG. 1; FIG. 3 is a sectional view illustrating an example of the structure obtained by cutting the semiconductor device along line B-B of FIG. 1; FIG. 4 is a sectional view illustrating an example of the structure obtained by cutting the semiconductor device along line C-C of FIG. 1; and FIG. 5 is a circuit block diagram illustrating an example of the system configuration of the semiconductor device in FIG. 1.

Description will be given to the semiconductor device in this embodiment.

The semiconductor device in this embodiment illustrated in FIG. 1 to FIG. 4 is a resin-sealed package. In this package, two semiconductor chips (first semiconductor chip, second semiconductor chip) are mounted side by side (plane configuration) over one die pad (chip placement portion, also referred to as tab) 3a. In the description of this embodiment, the following package will be taken as an example of the above semiconductor device: a thin SOP (Small Outline Package) 6 in which multiple leads are exposed (protruded) from each of two side surfaces 4a arranged opposite to each other among the sides of a sealing body 4 whose planar shape is a quadrangle. Of the leads, the portions exposed (protruded) from the sealing body 4 are outer leads (outer portions) 3c and they are so formed that they are bent in a gull wing shape outside the sealing body 4.

Detailed description will be given to the configuration of the SOP 6. The SOP includes: a die pad 3a (also referred to as tab), or a plate-like chip placement portion whose planar shape is a quadrangle, illustrated in FIG. 1; an MCU (Micro Control Unit) chip 1 as a first semiconductor chip and an AFE (Analog Front End) chip 2 as a second semiconductor chip mounted side by side over the die pad 3a; multiple inner leads (inner portions) 3b electrically connected with the respective semiconductor chips; and multiple outer leads 3c respectively formed integrally with the inner leads 3b.

Each of the MCU chip 1 and the AFE chip 2 is electrically connected with inner leads 3b via a wire 5 as a conductive thin wire.

The die pad 3a has a planar shape of a quadrangle (rectangle in this embodiment) including: a pair of first sides (long sides) 3aa, 3ab opposed to each other and a pair of second sides (short sides) 3ac, 3ad intersecting with the first sides 3aa, 3ab and opposed to each other. In this embodiment, as illustrated in FIG. 1, a cutout portion (notch 3e) is formed in each long side. For this reason, though the planar shape of the die pad 3a is accurately polygonal, the size (dimensions) of each of these cutout portions (notches 3e) is small for the die pad 3a. In this embodiment, consequently, the shape of the die pad is defined as quadrangular despite the provision of these cutout portions (notches 3e). Each of one second side 3ac and the other second side 3ad is coupled (formed integrally) with two suspending leads 3d. Therefore, the die pad 3a is supported by the four suspending leads 3d. In this embodiment, as mentioned above, there are four suspending leads 3d. However, when each suspending lead is large in width or thickness or high in strength, only one suspending lead 3d may be coupled to each second side as described later.

The MCU chip 1, AFE chip 2, die pad 3a, inner leads 3b and suspending leads 3d, and wires 5 are sealed with a sealing body 4 formed of sealing resin. The sealing body 4 is rectangular in planar shape.

As illustrated in FIG. 4, each of the four suspending leads 3d supporting the die pad 3a is bent (tab descending processing) so that the height of the die pad 3a is reduced. This makes it possible to make the following quantities of resin substantially equal to each other in the sealing body 4 and reduce warpage in the SOP body: the quantity of resin on the back surface side of the die pad 3a and the quantity of resin above the two semiconductor chips.

As illustrated in FIG. 1, most of the inner leads 3b are arranged along the first sides 3aa, 3ab, or the long sides of the rectangular die pad 3a, opposed to each other. More specific description will be given. A first lead group 3ba, or a group of the leads arranged in positions corresponding to the first side 3aa of the die pad 3a among the inner leads 3b, is arranged opposite to the first side 3aa; meanwhile, a second lead group 3bb, or a group of the leads arranged in positions corresponding to the first side 3ab of the die pad 3a, is arranged opposite to the first side 3ab.

The inner leads 3b (the respective inner portions of the leads) making up the first lead group 3ba and the second lead group 3bb are bent as follows: they are bent from the outer leads 3c (the respective outer portions of the leads) toward the die pad 3a in the plan view. This makes it possible to wire each wire 5 so that they are substantially linearly extended in the direction in which the inner leads 3b are extended in the plan view and reduce the wire length of each wire 5. When only the suppression of a void (resin unfilled failure) between the semiconductor chips adjoining to each other is taken into account, the inner leads 3b may be so formed that they are identical in length and linearly extended (not bent).

In this embodiment, some of the bonding pads of the AFE chip 2 are also arranged on the right side 2n as viewed in FIG. 1. In this embodiment, for this reason, some leads in the first lead group 3ba and the second lead group 3bb of the inner leads 3b are so extended that the following is implemented: their tips go around toward the short sides (for example, the second side 3ad) of the die pad 3a. This makes it possible to reduce also the length of each wire joined with such a bonding pad. Also with respect to the AFE chip 2, as for the MCU chip 1, the following measure need not be taken when multiple bonding pads are arranged on three sides (2j, 2k, 2m as viewed in FIG. 1 in this example): the tips of inner leads 3b need not be arranged in positions corresponding to a short side of the die pad 3a.

As illustrated in FIG. 2 and FIG. 3, the outer leads 3c formed integrally with the inner leads 3b are protruded from the side surfaces 4a of the sealing body 4 on both sides and bent and formed in a gull wing shape.

The MCU chip 1 and the AFE chip 2 are each bonded to the die pad 3a by paste adhesive, such as silver paste. However, they may be bonded via a film-like adhesive, such as DAF (Die Attach Film).

Figure 7:
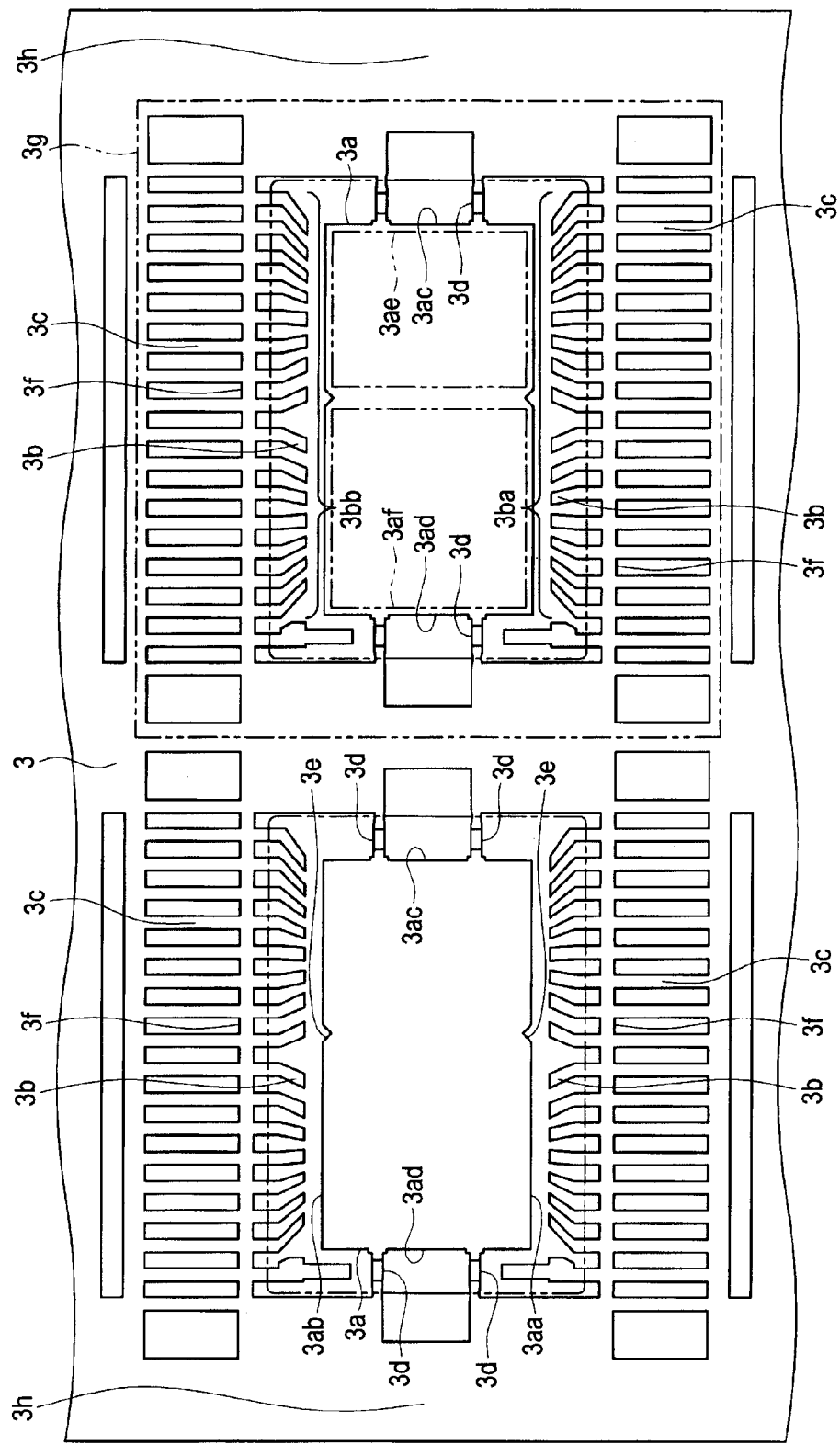
FIG. 7 is an enlarged partial plan view illustrating an example of the structure of a lead frame used in the assembly of the semiconductor device in FIG. 1.

At this time, the MCU chip 1 is mounted in a first area Sae of the die pad 3a illustrated in FIG. 7 and the AFE chip 2 is mounted in a second area 3af positioned next to the first area Sae in the plan view. Here, the second side Sac of the two second sides 3ac, 3ad of the die pad 3a will be taken as one side and the second side 3ad will be taken as the other side. In this case, the second area 3af is positioned between the first area Sae and the other second side 3ad of the die pad 3a in the plan view.

In the SOP 6 in this embodiment, as illustrated in FIG. 1, a notch (cutout portion) 3e is formed in the first side 3aa and the first side 3ab between the first area Sae and the second area 3af in FIG. 7 in the die pad 3a.

These notches 3e are used as a marker when each chip placement area (first area 3ae, second area 3af) is discriminated (recognized) at the die bonding step, described later, of placing the MCU chip 1 and the AFE chip 2 over the die pad 3a.

It is desirable that the notches 3e as markers for the chip placement areas should be provided as close to each semiconductor chip as possible because the accuracy of position recognition can be enhanced. Therefore, it is very effective to provide the markers in the die pad 3a. The markers need not be cutouts and they could be formed in such a shape that they are protruded from the die pad 3a. However, when a lead frame is processed by etching, it can be more easily processed when the distance between the die pad 3a and the tip of each inner lead is identical (uniform) from inner lead 3b to inner lead 3b. Therefore, it is desirable that a notch 3e should be used as a marker in terms of lead frame processing as well.

When the notches 3e provided in the die pad 3a are used as markers, the distance between the MCU chip 1 and the AFE chip 2 can be made shorter than the distance between the chips in the following cases: cases where slits (through holes) 53a are provided as in the semiconductor package 50 in the comparative example in FIG. 27. In the SOP 6 in this embodiment illustrated in FIG. 1, the distance (spacing) between the chips, that is, between the MCU chip 1 and the AFE chip 2 can be set to less than 0.8 mm, preferably, 0.3 to 0.4 mm or so. This distance of 0.3 to 0.4 mm is smaller than or substantially identical with, for example, the lead width of each outer lead (outer portion) 3c protruded (exposed) from the sealing body 4. When the portion (inner lead, inner portion) sealed with the sealing body 4 of each lead is bent for the reduction of wire length or in accordance with the direction of extension of each wire 5, the following takes place: it is narrower than the width of its portion (outer lead, outer portion) 3c protruded (exposed) from the sealing body 4. In this case, the outer leads 3c are taken as a target for comparison.

When the notches 3e are provided as markers for chip placement areas in the die pad 3a as mentioned above, the distance between the two chips can be shortened as compared with the above-mentioned cases where slits 53a are used. This makes it possible to shorten the first sides 3aa, 3ab as the long sides of the die pad 3a and reduce the size of the die pad 3a.

As a result, the long sides of the sealing body 4 can also be shortened and thus reduction of the size of the SOP 6 (semiconductor device) can be achieved.

Description will be given to the MCU chip 1 and the AFE chip 2 incorporated in the SOP 6.

The MCU chip 1 is a semiconductor chip in which integrated circuits, such as CPU (Central Processing Unit), memory, an input/output circuit, and a timer circuit, are formed. As illustrated in FIG. 4, the MCU chip 1 has a front surface (first front surface, main surface) 1a and a back surface (first back surface) 1b located on the opposite side to the front surface 1a. As illustrated in FIG. 1, multiple bonding pads (first bonding pads, electrode pads) 1c are formed on the front surface 1a.

Meanwhile, the AFE chip 2 is a semiconductor chip including an analog circuit portion used before analog/digital conversion. As illustrated in FIG. 4, similarly to the MCU chip 1, the AFE chip 2 has a front surface (second front surface, main surface) 2a and a back surface (second back surface) 2b located on the opposite side to the front surface 2a. As illustrated in FIG. 1, multiple bonding pads (second bonding pads, electrode pads) 2c are formed on the front surface 2a.

Here, the types of the multiple bonding pads 1c, 2c provided in the MCU chip 1 and the AFE chip 2 illustrated in FIG. 1 are classified as follows: the pads electrically connected to the inner leads 3b connecting to the outer leads 3c via a wire 5 are classified as external; and the pads electrically connected between the MCU chip 1 and the AFE chip 2 via a wire 5 are classified as internal. Thus multiple external bonding pads 1ca among the bonding pads 1c of the MCU chip 1 and multiple inner leads 3b in the first lead group 3ba are electrically connected with each other via multiple external wires 5a.

Further, the following are electrically connected with each other via multiple external wires 5a: multiple external bonding pads 1ca among the bonding pads 1c of the MCU chip 1 and multiple inner leads 3b in the second lead group 3bb located on the opposite side to the first lead group 3ba.

Meanwhile, multiple external bonding pads 2ca among the bonding pads 2c of the AFE chip 2 and multiple inner leads 3b in the first lead group 3ba are electrically connected with each other via multiple external wires 5a.

Similarly, the following are electrically connected with each other via multiple external wires 5a: multiple external bonding pads 2ca among the bonding pads 2c of the AFE chip 2 and multiple inner leads 3b in the second lead group 3bb located on the opposite side to the first lead group 3ba.

Between the two chips, the multiple internal bonding pads 1cb among the bonding pads 1c and the multiple internal bonding pads 2cb among the bonding pads 2c are respectively electrically connected with each other via multiple internal wires 5b.

That is, multiple bonding pads 1c electrically connected with inner leads 3b in the first lead group 3ba are arranged along the following side in the front surface 1a of the MCU chip 1: the side 1j of the MCU chip 1 close to the first side 3aa of the die pad 3a. Meanwhile, multiple bonding pads 1c electrically connected with inner leads 3b in the second lead group 3bb are arranged along the side 1k of the MCU chip 1 close to the first side 3ab of the die pad 3a.

Similarly, multiple bonding pads 2c electrically connected with inner leads 3b in the first lead group 3ba are arranged along the following side in the front surface 2a of the AFE chip 2: the side 2j of the AFE chip 2 close to the first side 3aa of the die pad 3a. Meanwhile, multiple bonding pads 2c electrically connected with inner leads 3b in the second lead group 3bb are arranged along the side 2k of the AFE chip 2 close to the first side 3ab of the die pad 3a.

The bonding pads 1c, 2c electrically connecting the two chips with each other are arranged along the respective sides 1m, 2m opposed to each other between the chips.

FIG. 5 illustrates an example of a circuit block diagram of the system configuration of the SOP 6 and a battery pack 8 is taken as an example of a peripheral circuit. In this example, the SOP 6 is electrically connected with a lithium-ion battery cell 7a, a control FET (Field Effect Transistor) 7b, and the like and they make up the battery pack 8.

In the MCU chip 1 embedded in the battery pack 8, the following are formed: a digital internal interface circuit 1d, a digital external interface circuit 1e, an analog internal interface circuit 1f, an analog external interface circuit 1g, a signal processing circuit (other circuit) 1h, and the like.

Also in the AFE chip 2, the following are similarly formed: a digital internal interface circuit 2d, a digital external interface circuit 2e, an analog internal interface circuit 2f, an analog external interface circuit 2g, a signal processing circuit (other circuit) 2h, and the like.

That is, neither in the MCU chip 1 nor in the AFE chip 2, digital and analog signals are directly communicated. They are converted by way of the respective signal processing circuits 1h, 2h and communicated. Detailed description will be given to signal input/output operation. A digital signal supplied from an external source is supplied to the digital external interface circuit 1e of the MCU chip 1 through a lead and a bonding pad. Then it is supplied to the digital internal interface circuit 1d by way of the signal processing circuit 1h formed in the MCU chip 1. Thereafter, the digital signal is transferred to the digital internal interface circuit of the AFE chip 2 through a bonding pad and a wire. Then the digital signal processed at the AFE chip 2 is returned to the digital internal interface circuit 1d of the MCU chip 1 through a wire and a bonding pad. There are a wide variety of operations (driving). In some cases, for example, a digital signal transferred to the digital internal interface circuit 2d of the AFE chip 2 is converted into an analog signal at the signal processing circuit 2h of the AFE chip 2. Thereafter, it is supplied to the lithium-ion battery cell 7a as external equipment by way of the analog external interface circuit 2g of the AFE chip 2. In other cases, an analog signal is transferred to the analog internal interface circuit 1f of the MCU chip 1 by way of the analog internal interface circuit 2f of the AFE chip 2, a wire, and a bonding pad.

As mentioned above and illustrated in FIG. 1, not only the MCU chip 1 but also the AFE chip 2 is provided with the following external bonding pads: multiple external bonding pads 2ca (2c) for directly communicating signals with an external source through wires 5, inner leads 3b, and outer leads 3c. For this reason, these external bonding pads 2ca are arranged along the side 2j of the AFE chip 2 close to the first side 3aa of the die pad 3a and the side 2k close to the first side 3ab located opposite thereto.

As illustrated in FIG. 1 and FIG. 5, the internal bonding pads 1cb of the MCU chip 1 are divided into the following groups: a first pad group 1cc electrically connected with the digital internal interface circuit 1d of the MCU chip 1 and a second pad group 1cd electrically connected with the analog internal interface circuit 1f of the MCU chip 1. Meanwhile, of the external bonding pads 1ca of the MCU chip 1, the external bonding pads 1ca arranged on the upper side of the MCU chip 1 in FIG. 1 are electrically connected with the digital external interface circuit 1e of the MCU chip 1; and the external bonding pads 1ca arranged on the lower side of the MCU chip 1 in FIG. 1 are electrically connected with the analog external interface circuit 1g of the MCU chip 1.

Similarly, the internal bonding pads 2cb of the AFE chip 2 are divided into the following groups: a third pad group 2cc electrically connected with the digital internal interface circuit 2d of the AFE chip 2 and a fourth pad group 2cd electrically connected with the analog internal interface circuit 2f of the AFE chip 2.

The internal wires 5b coupling both the chips together are divided into the following wires: multiple internal digital wires 5c respectively electrically connecting together the bonding pads 1c in the first pad group 1cc and the bonding pads 2c in the third pad group 2cc; and multiple internal analog wires 5d respectively electrically connecting together the bonding pads 1c in the second pad group 1cd and the bonding pads 2c in the fourth pad group 2cd.

In the SOP 6, as illustrated in FIG. 1, the distance L between the first pad group 1cc and the second pad group 1cd is larger than the distance M between the third pad group 2cc and the fourth pad group 2cd (L>M). In this embodiment, the outer dimensions of the respective bonding pads 1c, 2c in the first pad group 1cc, second pad group 1cd, third pad group 2cc, and fourth pad group 2cd are substantially identical. The distance L between the first pad group 1cc and the second pad group 1cd is larger than or equal to the length equivalent to multiple ones of the bonding pads. In detail, the distance L is larger than or substantially equal to the length equivalent to, for example, five bonding pads. (In other words, the distance L is larger than the length equal to five times the length of each side of each bonding pad 1c.) In this embodiment, the planar shape of each bonding pad is a quadrangle having sides aligned with the sides 1m, 2m and their outer dimensions are, for example, 75 μm×75 μm. The reason why the distance L is larger than the length equivalent to five bonding pads will be described in detail later. A brief description thereof is as follows: in this embodiment, the signal processing circuit 1h is arranged between the first pad group 1cc and the second pad group 1d in the plan view; and the size of the signal processing circuit 1h (width in the direction along the side 1m) is substantially equivalent to five bonding pads 1c. This makes it easier for resin supplied from a gate to enter an opening (resin entering path) formed by the first pad group 1cc and the second pad group 1cd at a molding step. As a result, it is possible to enhance the quality of filling of resin between the MCU chip 1 and the AFE chip 2 adjoining to each other. When the distance L between the first pad group 1cc and the second pad group 1cd is enlarged, the opening through which resin enters can be widened. However, when this distance L is too large, it is difficult to place the first pad group 1cc and the second pad group 1cd along an identical side. In this embodiment, for this reason, it is desirable to calculate the distance based on the following: the length (2.7 mm in this embodiment) of the side 1m of the MCU chip used in this embodiment; the outer dimensions (75 μm square) of each bonding pad; and the number of the bonding pads arranged on the side 1m. With respect to the lower limit, meanwhile, the distance may be of the length equivalent to at least, for example, three bonding pads 1c as long as only the quality of filling of resin is taken into account. In this case, however, the size of the signal processing circuit 1h arranged between the first pad group 1cc and the second pad group 1d must be smaller than or substantially equal to the distance.

Description will be given to the reason why L>M in the SOP 6.

As illustrated in FIG. 1, the MCU chip 1 is smaller than the AFE chip 2 in chip size in the plan view. For example, the MCU chip 1 is 2.1 mm×2.7 mm in dimensions while the AFE chip 2 is 2.7 mm×2.7 mm in dimensions. The pitch of the bonding pads 1c of the MCU chip 1 is narrower than the pitch of the bonding pads 2c of the AFE chip 2. For example, the pad pitch of the MCU chip 1 is 80 μm while the pad pitch of the AFE chip 2 is 130 μm.

In the SOP 6, therefore, the MCU chip 1 is higher than the AFE chip 2 in the degree of integration. As illustrated in FIG. 4, however, the thickness of the MCU chip 1 is larger than the thickness of the AFE chip 2. For example, the thickness of the MCU chip 1 is 0.3 mm while the thickness of the AFE chip 2 is 0.2 mm.

In the MCU chip 1 and the AFE chip 2, the digital interface circuits (digital external interface circuits 1e, 2e, digital internal interface circuits 1d, 2d) produce noise. The analog interface circuits (analog external interface circuits 1g, 2g, analog internal interface circuits 1f, 2f) can be caused to malfunction by the influence of this noise.

Consequently, in the MCU chip 1 of the SOP 6 in this embodiment, the distance between the digital interface circuits and the analog interface circuits is widened. The propagation of noise can be suppressed by widening this distance to some extent. In the SOP 6, however, the degree of integration of the MCU chip 1 is higher than the degree of integration of the AFE chip 2 as mentioned above.

Figure 28:
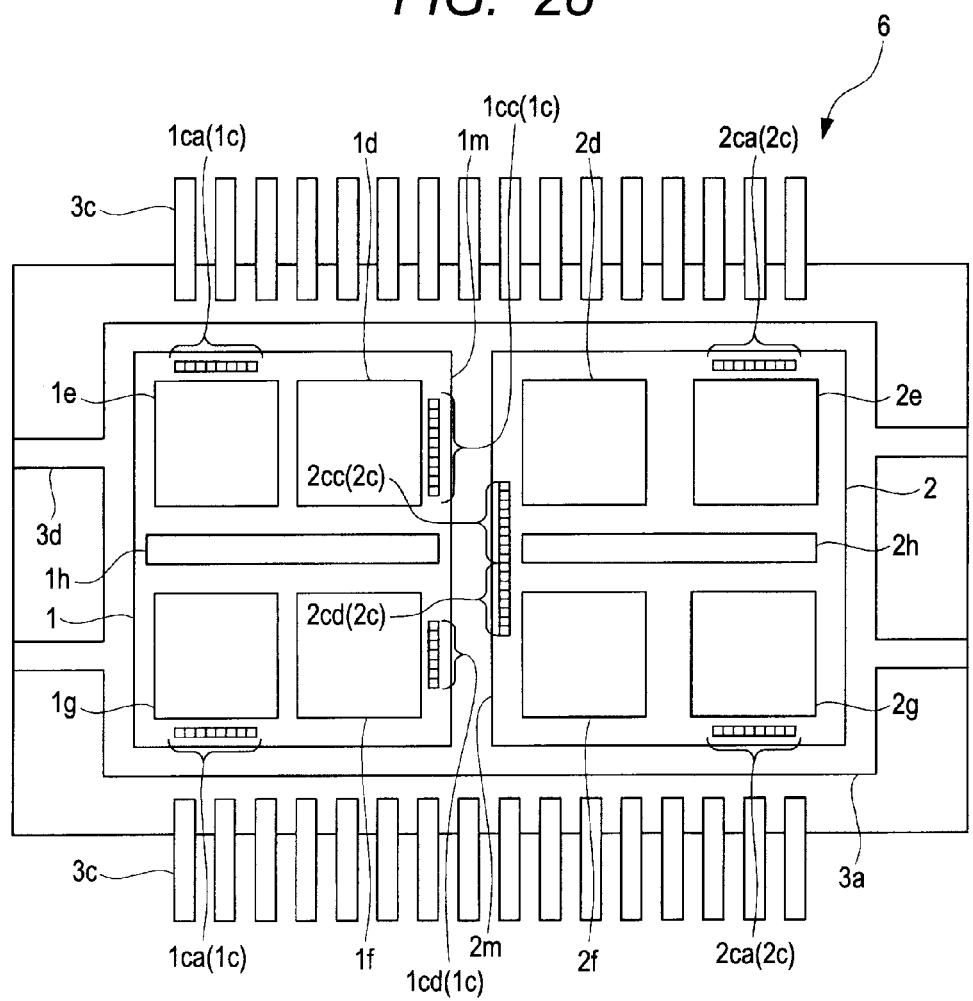
FIG. 28 is a plan view obtained by combining only portions required for the description of the circuit block diagram in FIG. 5 among the portions in the plan view in FIG. 1.

In the MCU chip 1, unlike the AFE chip 2, the signal processing circuit (other circuit) 1h is arranged between the digital interface circuits and the analog interface circuits. For the above reason, therefore, it is difficult to narrow the distance between the first pad group 1cc and the second pad group 1cd like the distance between the third pad group 2cc and the fourth pad group 2cd of the AFE chip 2. This will be described in detail with reference to FIG. 28. FIG. 28 is a plan view in which only items related to each circuit illustrated in FIG. 5 are extracted from FIG. 1 and the circuit block diagram illustrated in FIG. 5 is combined with each chip (MCU chip 1, AFE chip 2). Each bonding pad 1c in this embodiment is actually laid out in the positions shown in FIG. 1. In FIG. 28, the bonding pads 1c are shown in positions different from those in the layout in FIG. 1 to make it easy to find, for example, the following: the external bonding pads 1ca and which circuit (the digital and analog external interface circuits 1e, 1g in this example) among the multiple circuits corresponds to these external bonding pads 1ca. The cutout portions (notches 3e) formed in the die pad 3a and the planar shape of each lead 3ba, 3bb are unnecessary for the description here and they are not shown in FIG. 28.

As is understood from FIG. 28 as well, the MCU chip 1 is higher than the AFE chip 2 in the degree of integration; therefore, the signal processing circuit 1h is arranged to the vicinity of the 1m opposed to the AFE chip 2 among the sides of the MCU chip 1. When a bonding pad is arranged over a circuit, there is a possibility that the circuit is damaged by bonding load produced at the wire bonding step described later. In this embodiment, therefore, a bonding pad is not arranged over each circuit. As a result, the first pad group 1cc is away from the second pad group 1cd by an amount equivalent to the distance L in FIG. 1. Meanwhile, the AFE chip 2 is lower than the MCU chip 1 in the degree of integration; therefore, the signal processing circuit 2h can be brought away from the side 2m opposed to the MCU chip 1 among the sides of the AFE chip 2. As a result, it is possible to arrange multiple bonding pads (third pad group 2cc, fourth pad group 2cd) 2c along the side 2m with substantially equal pitches. (It is possible to make the distance M between the third pad group 2cc and the fourth pad group 2cd in FIG. 1 narrower than the distance L.)

More detailed description will be given. MCU chips have been increasingly shrunk and the MCU chip 1 is high in the degree of integration of circuitry. Therefore, there is no margin in the arrangement of each circuit area and the signal processing circuit 1h is arranged in proximity to the side 1m close to the AFE chip 2 between the digital interface circuits and the analog interface circuits. That is, the signal processing circuit 1h is arranged between the following groups in the plan view (not shown): the first pad group 1cc electrically connected with the digital internal interface circuit 1d of the MCU chip 1 and the second pad group 1cd electrically connected with the analog internal interface circuit if of the MCU chip 1. Therefore, a pad group (bonding pads) cannot be arranged in this area. Meanwhile, AFE chips have not been shrunk so much as MCU chips 1 and thus the AFE chip 2 is lower than the MCU chip 1 in the degree of integration of circuitry. Therefore, there is a margin in circuit layout as compared with the MCU chip 1. In the AFE chip 2, therefore, the signal processing circuit (other circuit) 2h is arranged in an area other than the area between the digital interface circuits and the analog interface circuits.

In the AFE chip 2, therefore, the digital interface circuits and the analog interface circuits can be arranged with the area between them narrowed. As a result, it is possible to narrow the distance M between the third pad group 2cc and the fourth pad group 2cd illustrated in FIG. 1.

In the MCU chip 1, however, the area for the signal processing circuit 1h is located in the area between the digital interface circuits and the analog interface circuits. Therefore, the distance L between the first pad group 1cc and the second pad group 1cd illustrated in FIG. 1 is enlarged (L>M).

In the MCU chip 1, as a result, the area for the digital interface circuits and the area for the analog interface circuits can be separated from each other and thus it is possible to take measures against noise produced at the digital interface circuits.

In MCU chip 1, therefore, the circuits directly linked with an external source are arranged as follows: they are arranged on the side 1j of the MCU chip 1 close to the first side 3aa of the die pad 3a and the side 1k close to the first side 3ab located opposite thereto. In addition, the circuits linked with the AFE chip 2 are arranged close to the side 1m located in the position corresponding to the AFE chip 2. In addition, the following measure is taken also with respect to the digital interface circuits and the analog interface circuits for noise suppression: they are divided and respectively arranged on the side 1j close to the first side 3aa of the die pad 3a and on the side 1k close to the first side 3ab located opposite thereto.

In the MCU chip 1, as a result, the three-side pad arrangement is adopted as illustrated in FIG. 1. That is, the external bonding pads 1ca are divided and arranged on the side 1j of the MCU chip 1 close to the first side 3aa of the die pad 3a and the side 1k close to the first side 3ab located opposite thereto; and all the internal bonding pads 1*cb* linked with the AFE chip 2 are collectively arranged along the side 1*m* of the MCU chip 1 located in the position corresponding to the AFE chip 2.

That is, the arrangement of the bonding pads 1*c* of the MCU chip 1 is the three-side pad arrangement, in which the bonding pads 1*c* are arranged along three sides (sides 1*j*, 1*k*, 1*m*) of the front surface 1*a* thereof. Therefore, an inner lead 3*b* is not arranged in a position corresponding to the second side Sac of the die pad 3*a* (the side 1*n* of the MCU chip 1).

In the MCU chip 1, as mentioned above, a pad is not arranged on the side 1*n* and the three-side pad arrangement is adopted. As a result, it is possible to delete unnecessary leads to shorten the long sides of the sealing body 4 and achieve reduction of the size of the SOP 6. If a semiconductor chip 51 is of the four-side pad arrangement like the semiconductor package 50 in the comparative example in FIG. 27, leads 54 are also arranged in positions corresponding to a short side of the die pad 53 and this makes it difficult to shorten the long sides of the sealing body 57. In the SOP 6 in this embodiment, the three-side pad arrangement is adopted for the MCU chip 1 and thus it is possible to shorten the long sides of the sealing body 4 to achieve reduction of the size of the SOP 6.

In the SOP 6 in this embodiment, the following measure is taken in the AFE chip 2: two bonding pads 2*c* are formed also on the side 2*n* of the front surface 2*a* located in the position corresponding to the second side 3*ad* of the die pad 3*a*. Therefore, it is of the four-side pad arrangement. As the result of the provision of these two bonding pads 2*c*, the two inner leads 3*b* coupled to these bonding pads 2*c* are linear and longer than the other inner leads 3*b*.

This makes it possible to shorten the wire length of each of the wires 5 bonded to these two inner leads 3*b*.

The AFE chip 2 may also be of the three-side pad arrangement like the MCU chip 1, needless to add.

Description will be given to a manufacturing method of the SOP (semiconductor device) 6 in this embodiment.

Figure 6:
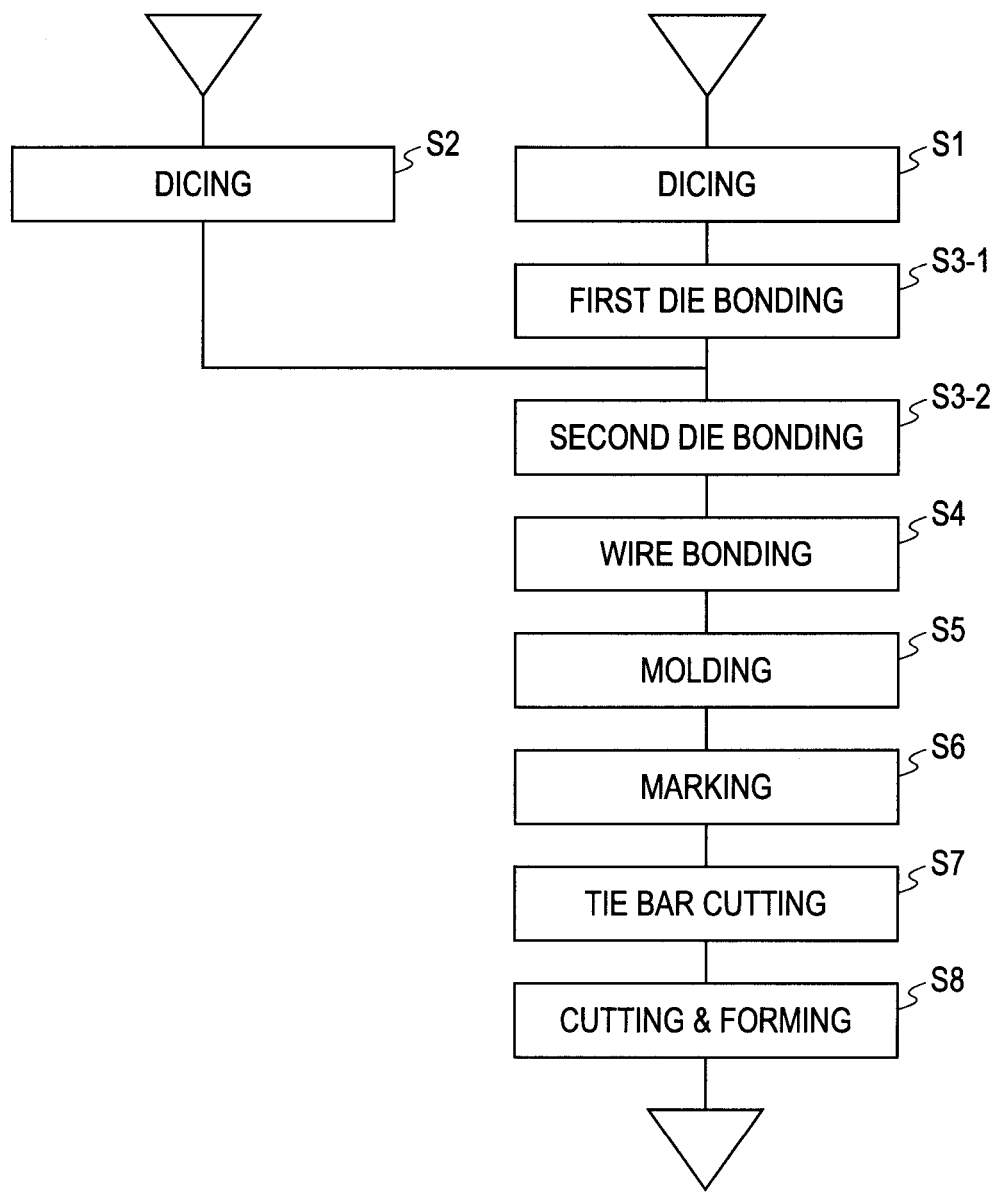
FIG. 6 is a manufacturing flowchart illustrating an example of the assembling procedure for the semiconductor device in FIG. 1.
Figure 8:
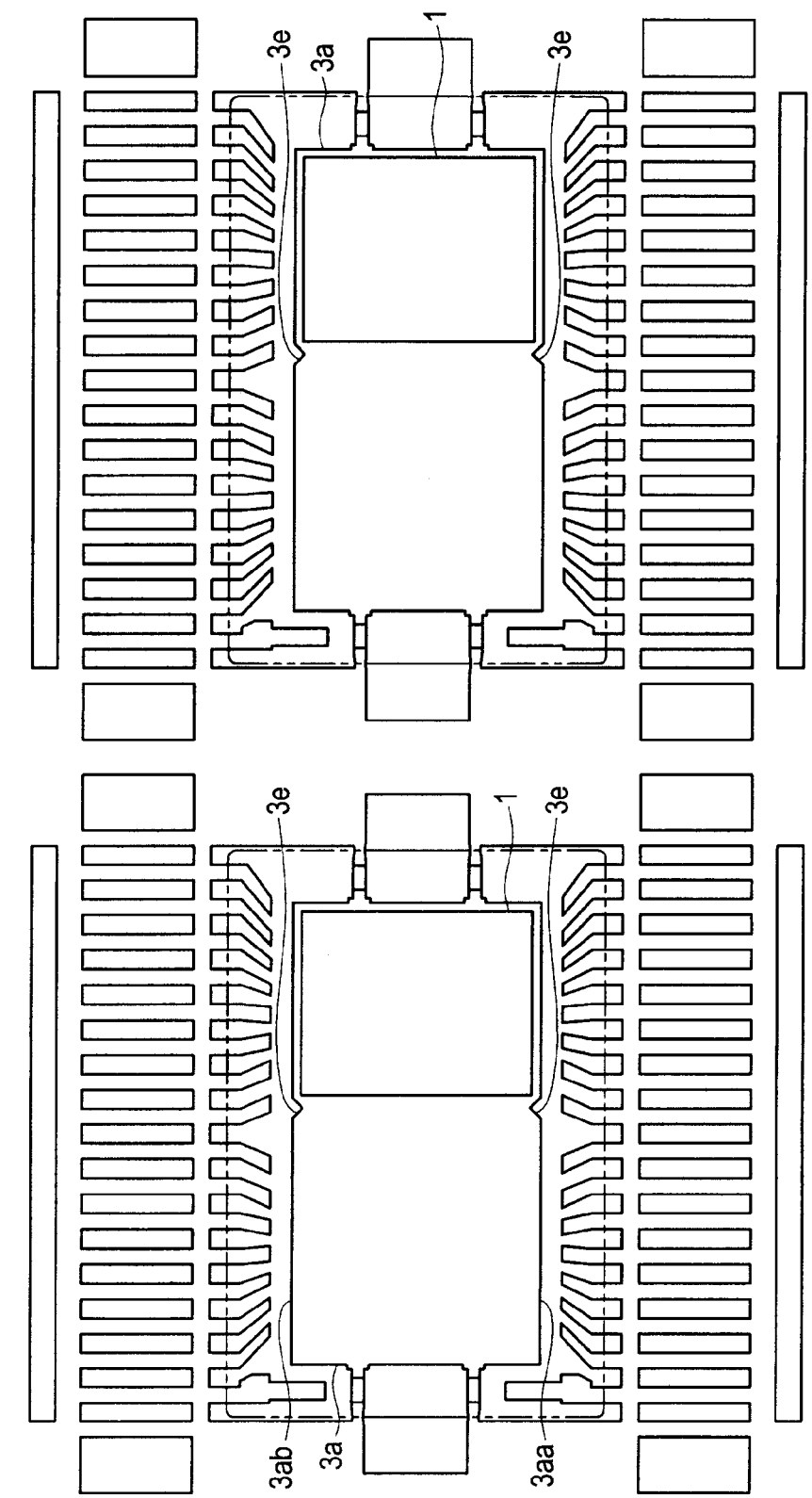
FIG. 8 is an enlarged partial plan view illustrating an example of the structure obtained after first die bonding in the assembly of the semiconductor device in FIG. 1.
Figure 9:
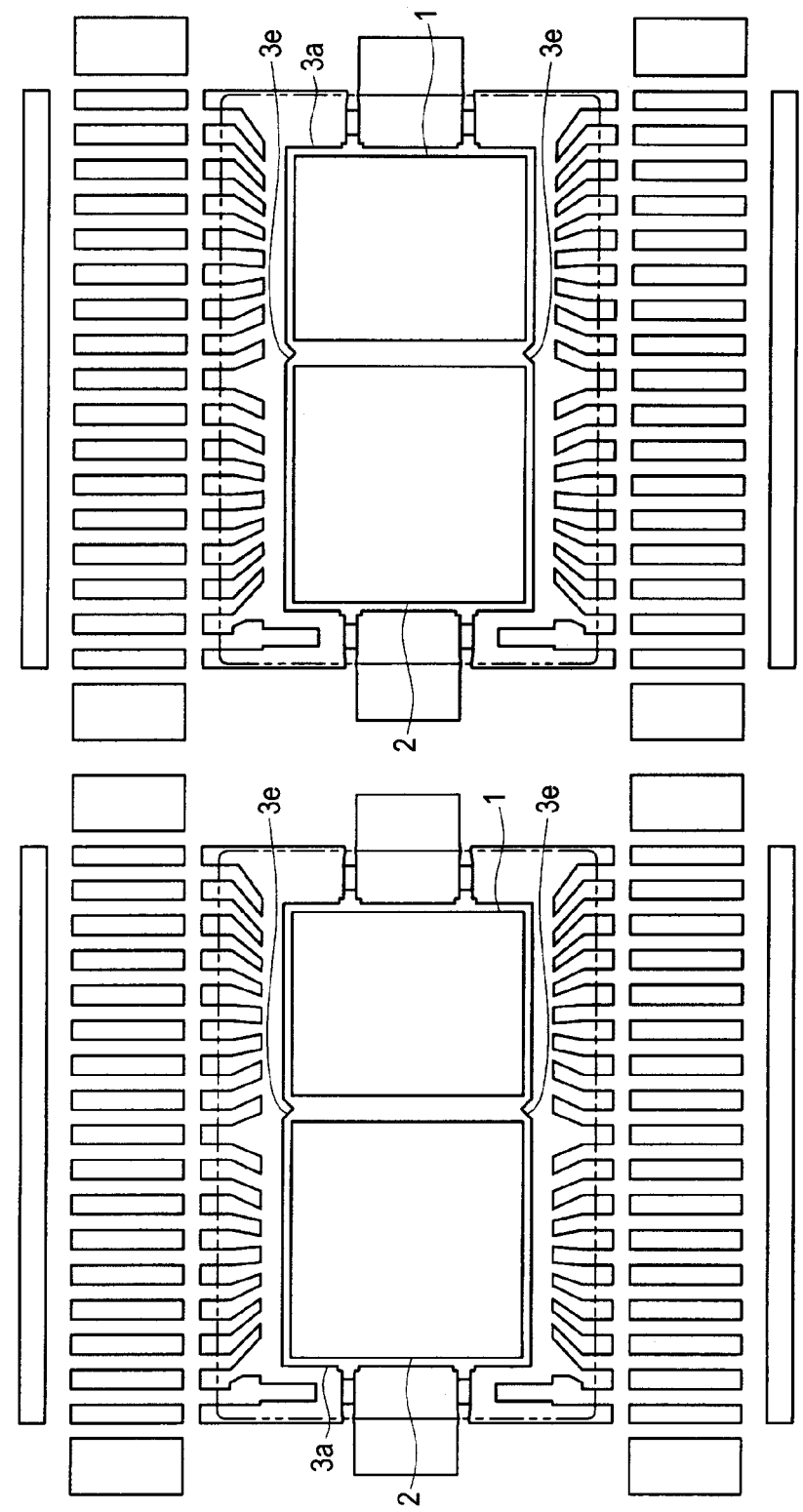
FIG. 9 is an enlarged partial plan view illustrating an example of the structure obtained after second die bonding in the assembly of the semiconductor device in FIG. 1.
Figure 10:
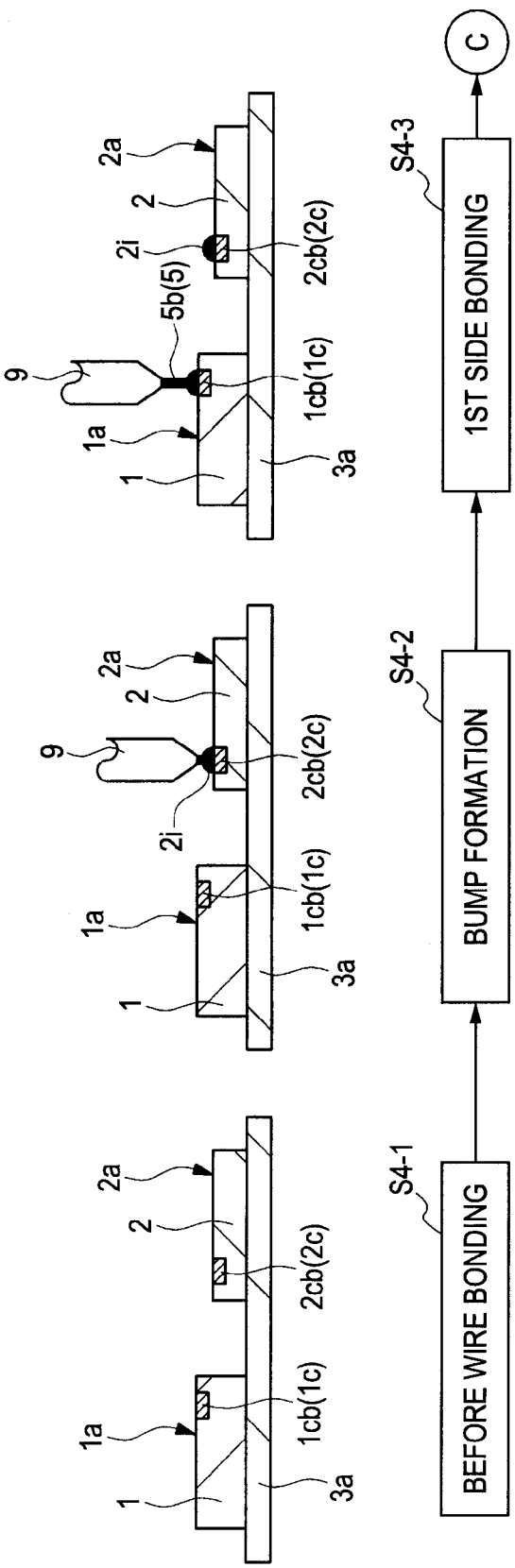
FIG. 10 is partial sectional views illustrating an example of procedures for joining chips together via a wire in wire bonding in the assembly of the semiconductor device in FIG. 1.
Figure 11:
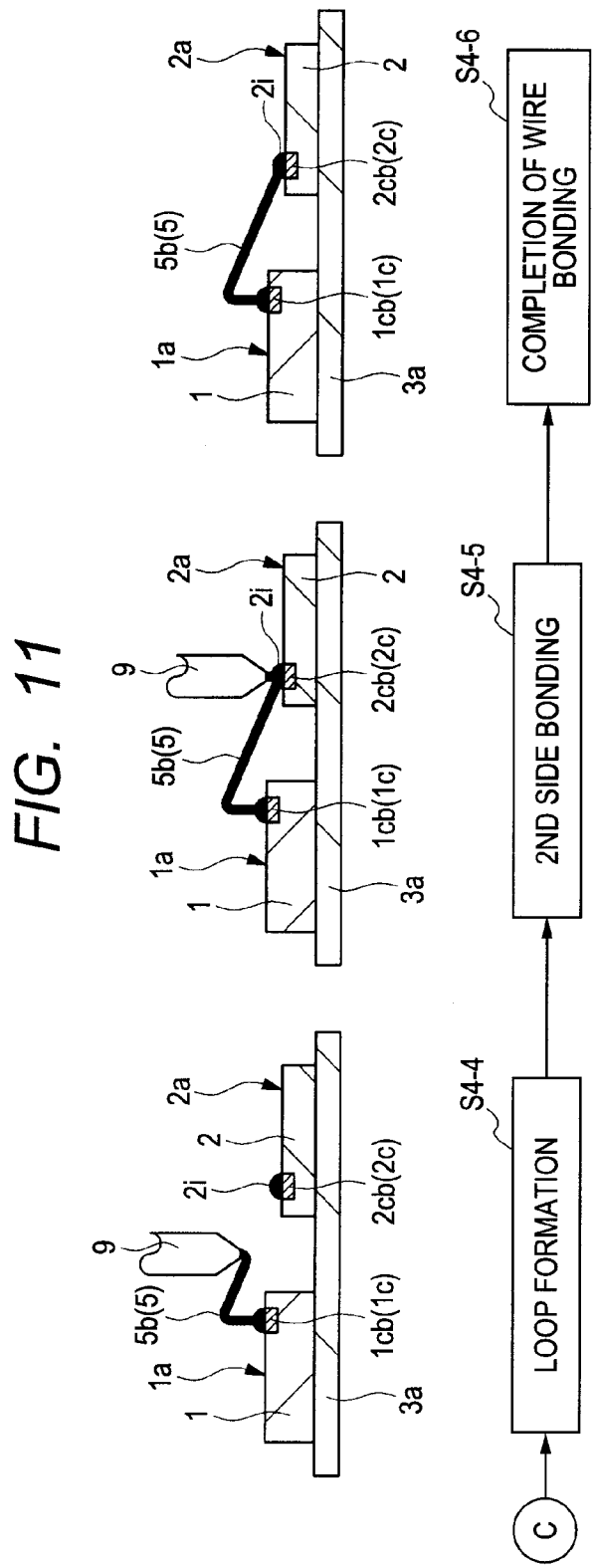
FIG. 11 is partial sectional views illustrating an example of procedures for joining the chips together via the wire in wire bonding in the assembly of the semiconductor device in FIG. 1.
Figure 12:
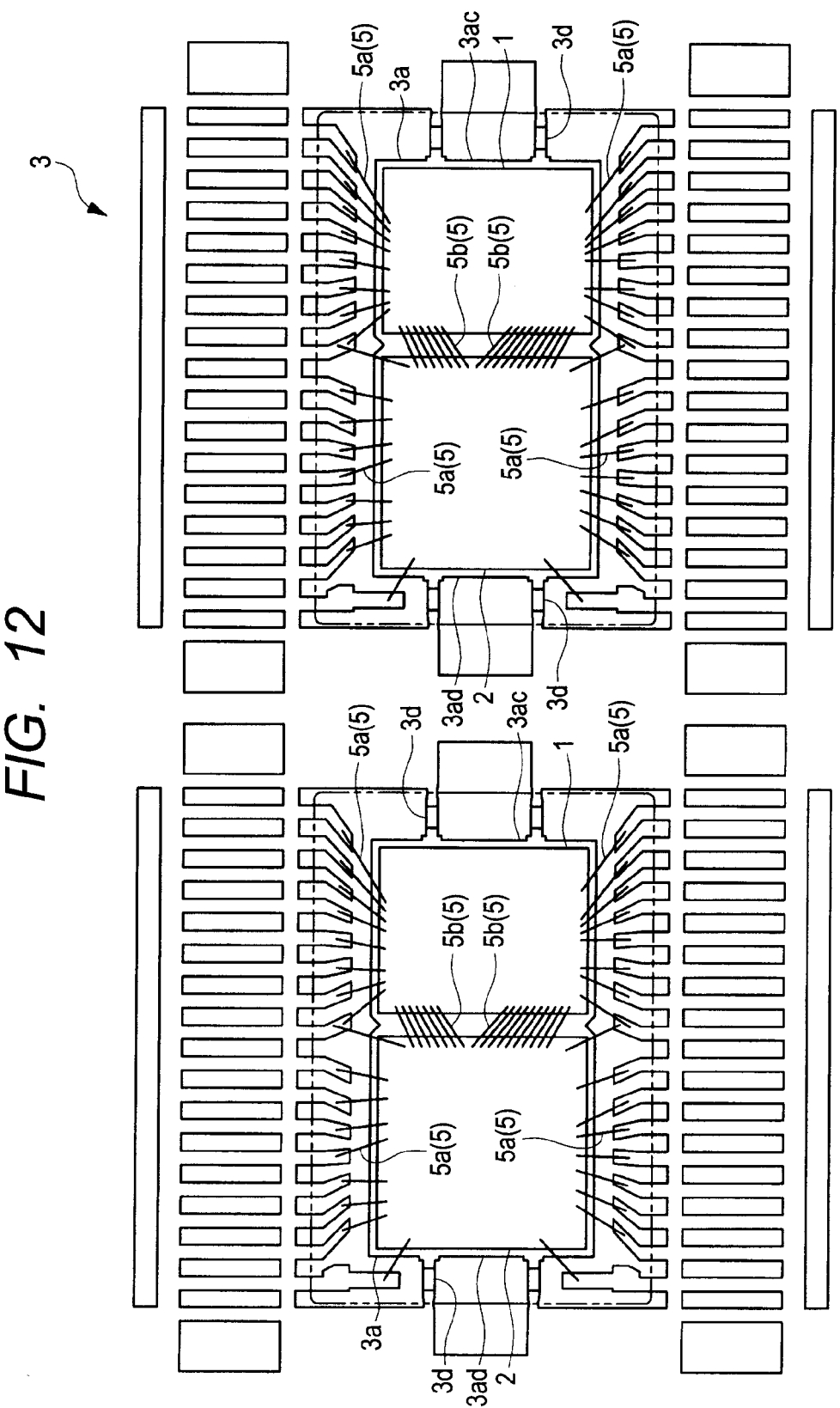
FIG. 12 is an enlarged partial plan view illustrating an example of the structure obtained after wire bonding in the assembly of the semiconductor device in FIG. 1.
Figure 13:
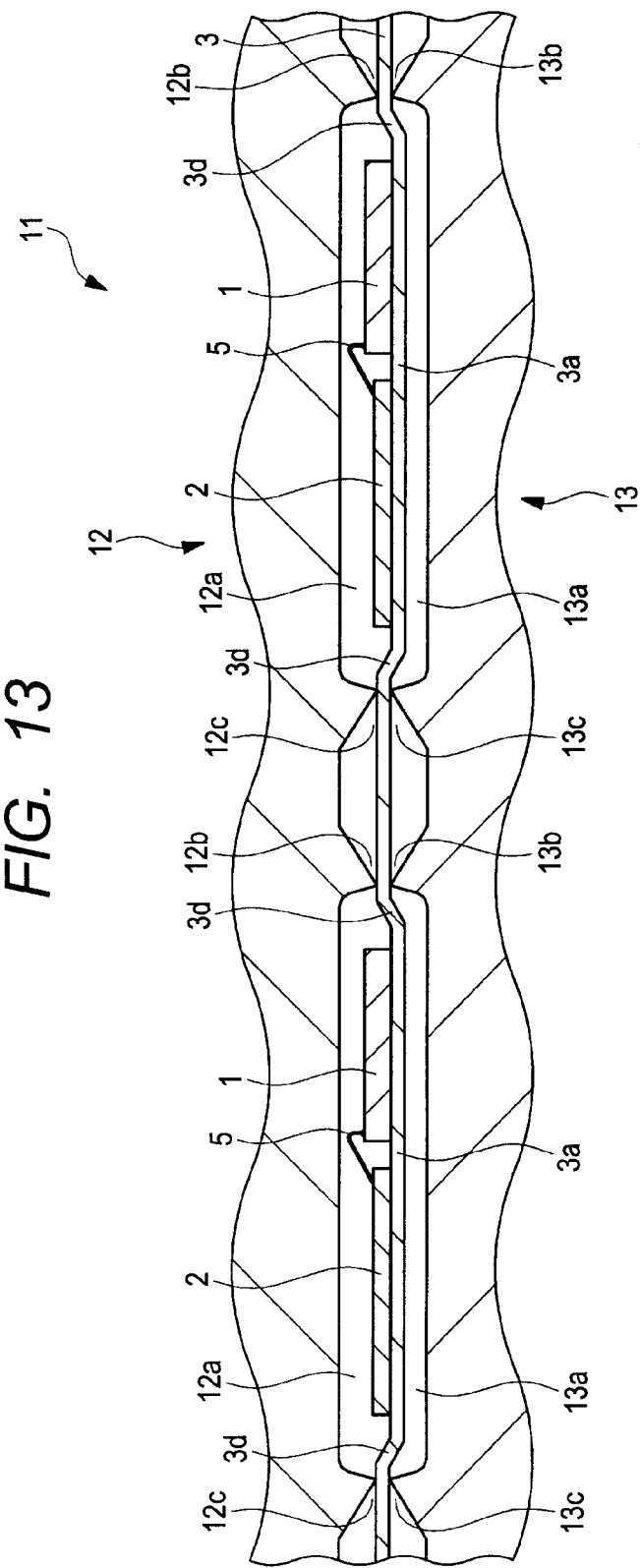
FIG. 13 is a partial sectional view illustrating an example of the structure obtained when dies are clamped in molding in the assembly of the semiconductor device in FIG. 1.
Figure 14:
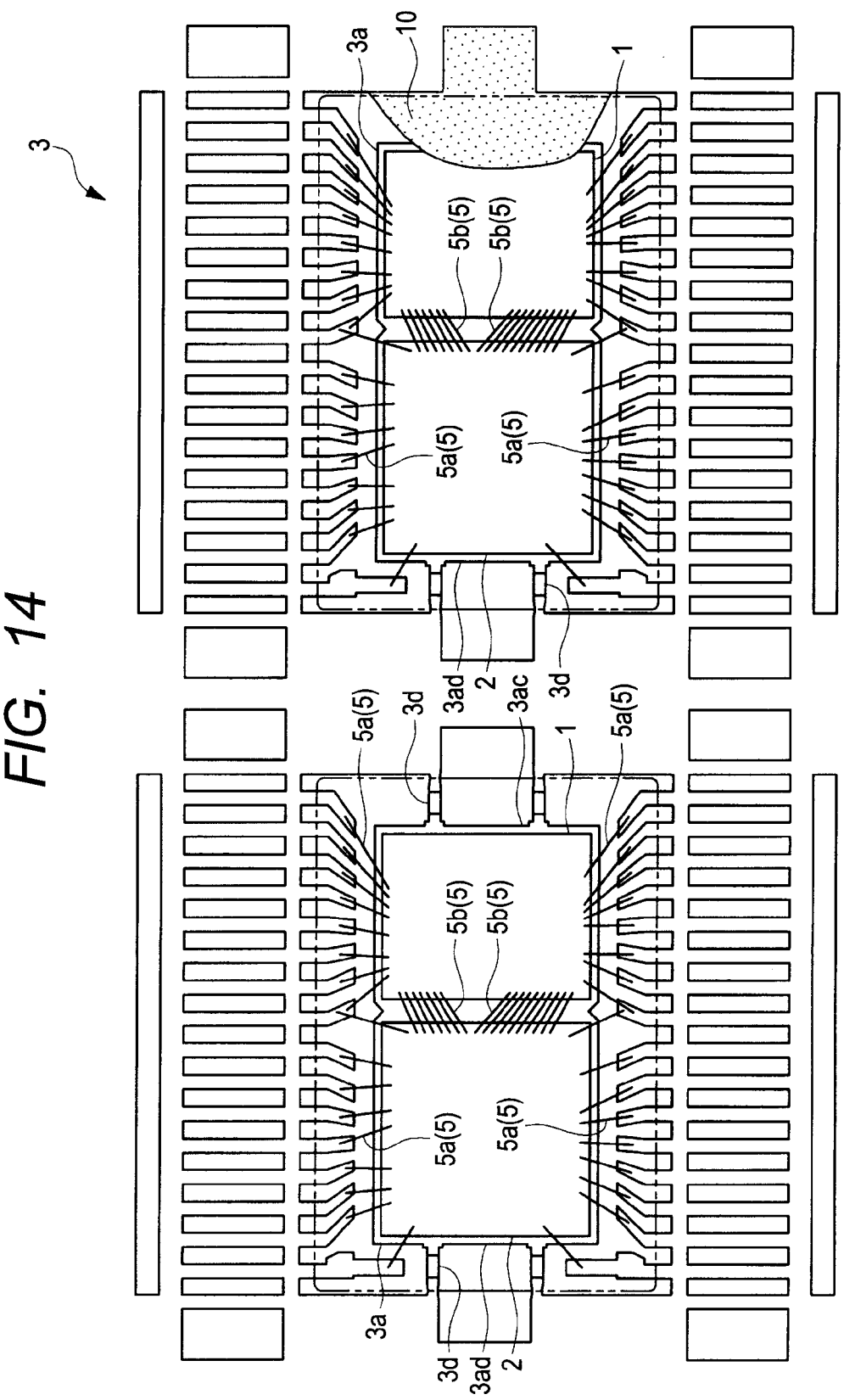
FIG. 14 is a plan view illustrating an example of the state of resin filling during molding (through molding) in the assembly of the semiconductor device in FIG. 1.
Figure 15:
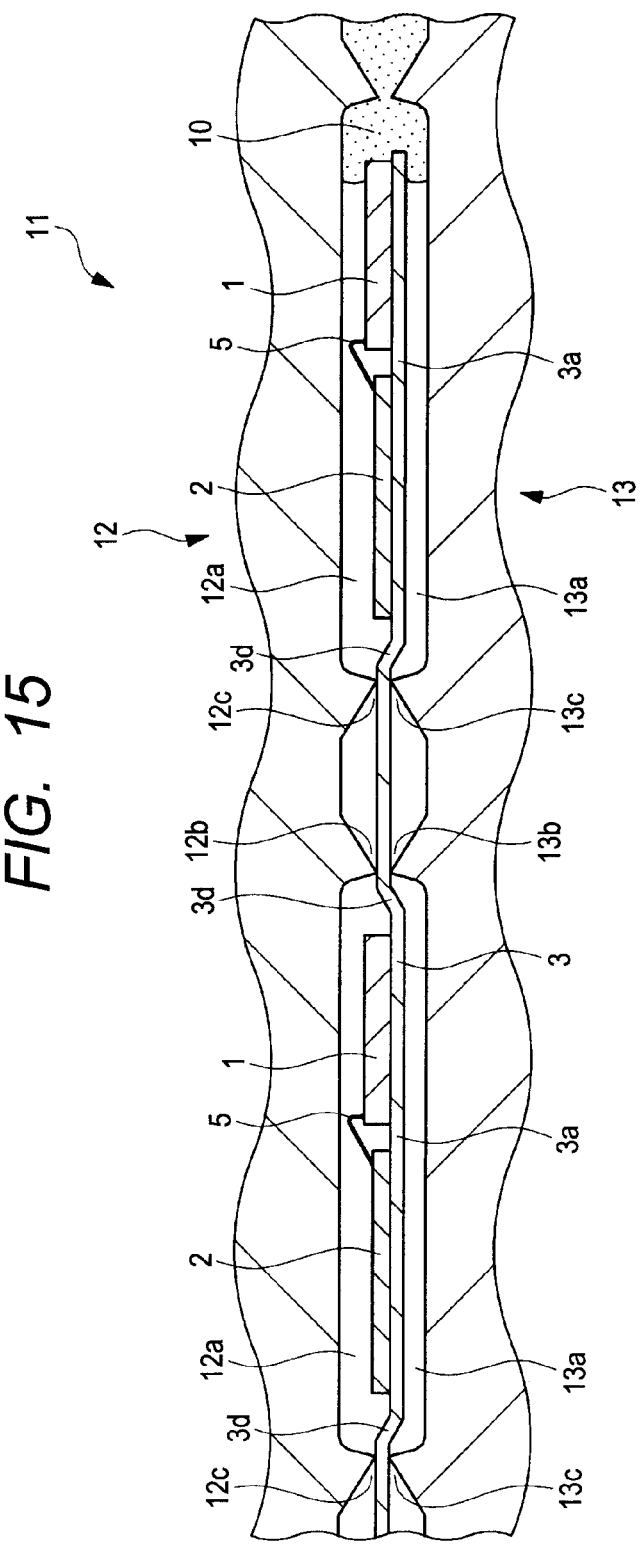
FIG. 15 is a partial sectional view illustrating an example of the state of resin filling illustrated in FIG. 14.
Figure 16:
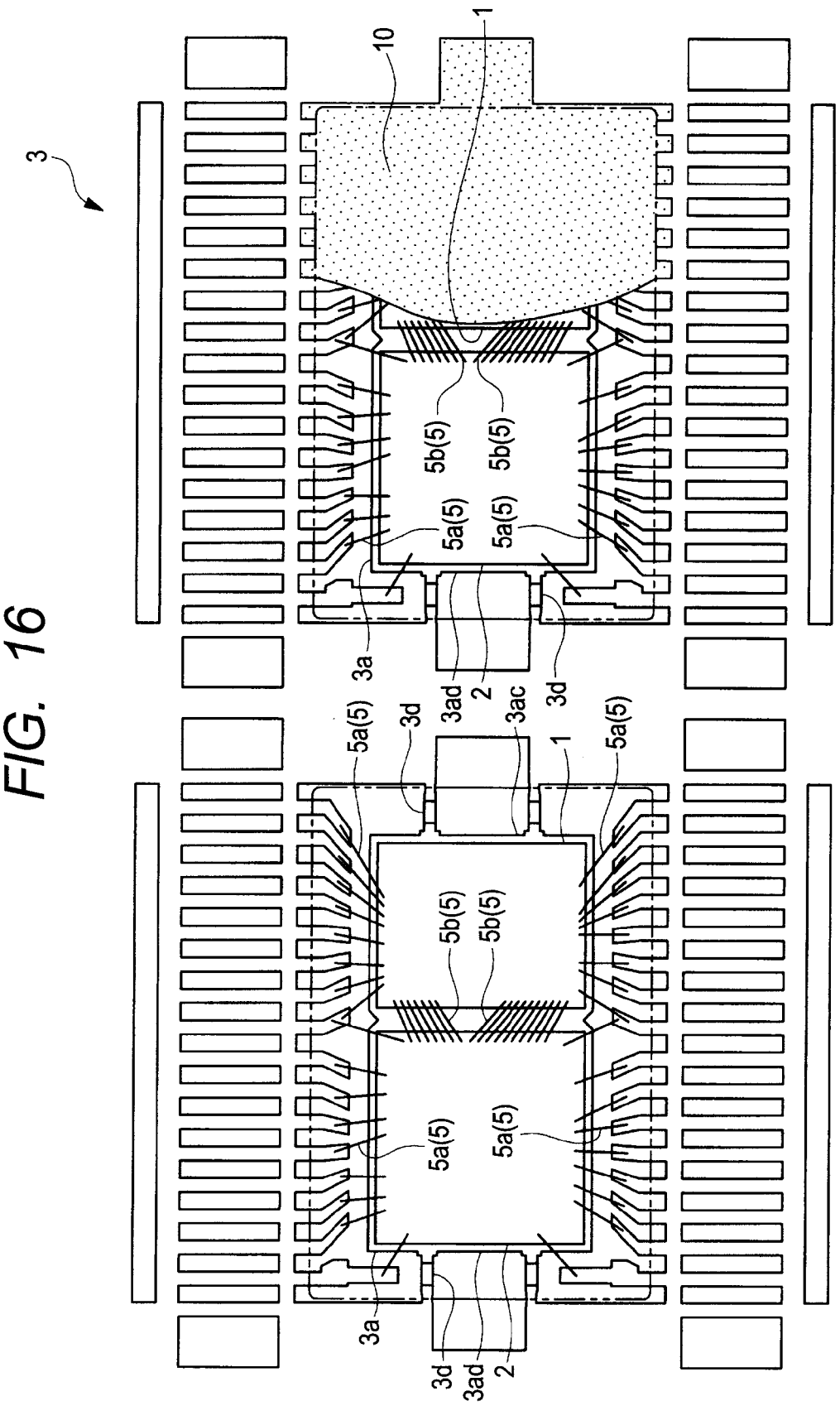
FIG. 16 is a plan view illustrating an example of the state of resin filling during molding (through molding) in the assembly of the semiconductor device in FIG. 1.
Figure 17:
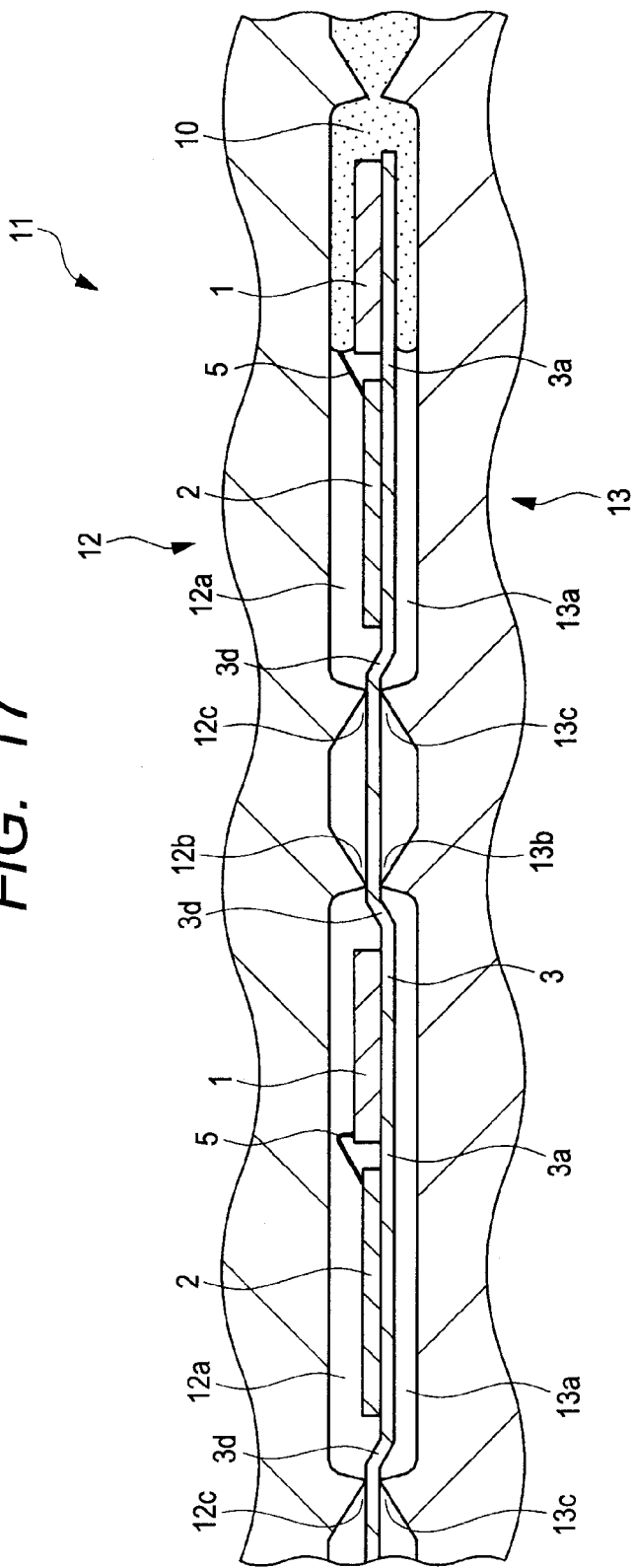
FIG. 17 is a partial sectional view illustrating an example of the state of resin filling illustrated in FIG. 16.
Figure 18:
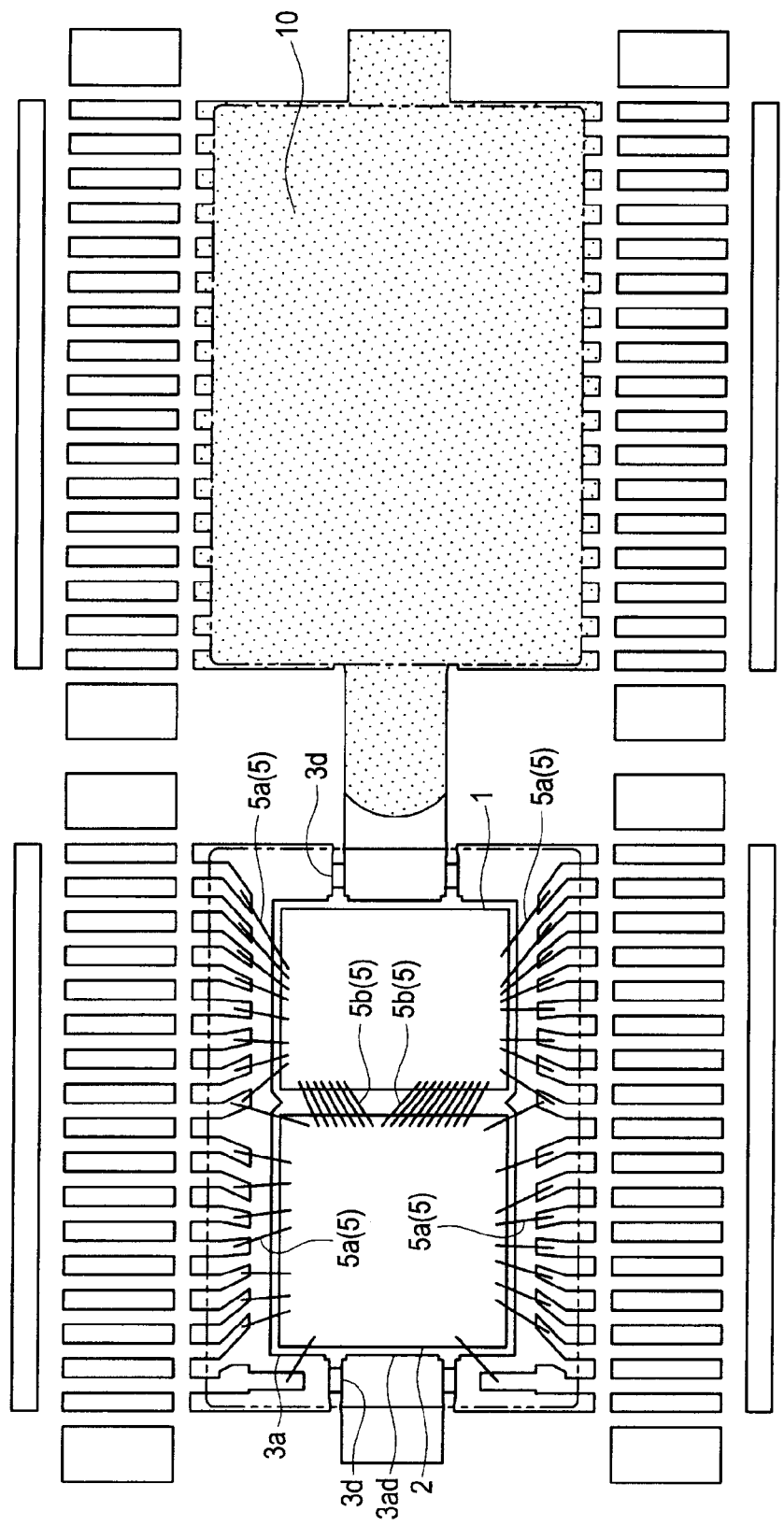
FIG. 18 is a plan view illustrating an example of the state of resin filling during molding (through molding) in the assembly of the semiconductor device in FIG. 1.
Figure 19:
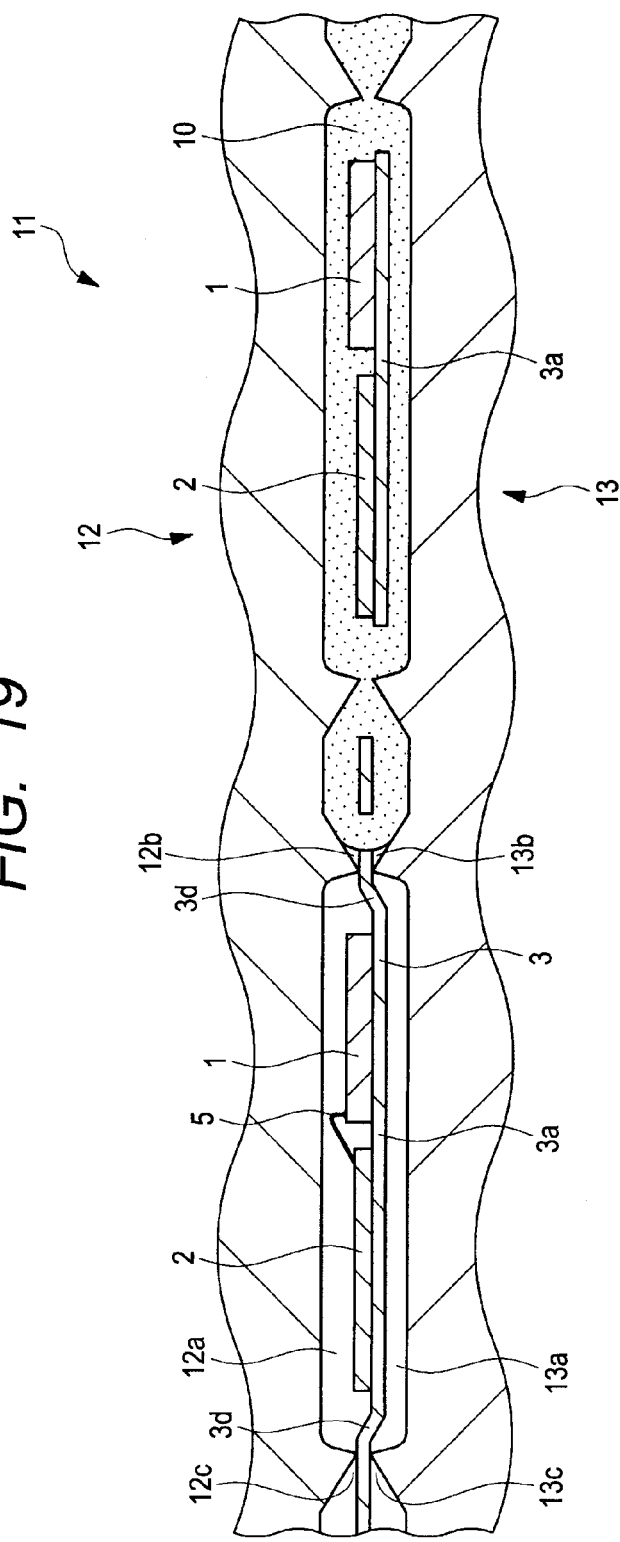
FIG. 19 is a partial sectional view illustrating an example of the state of resin filling illustrated in FIG. 18.
Figure 20:
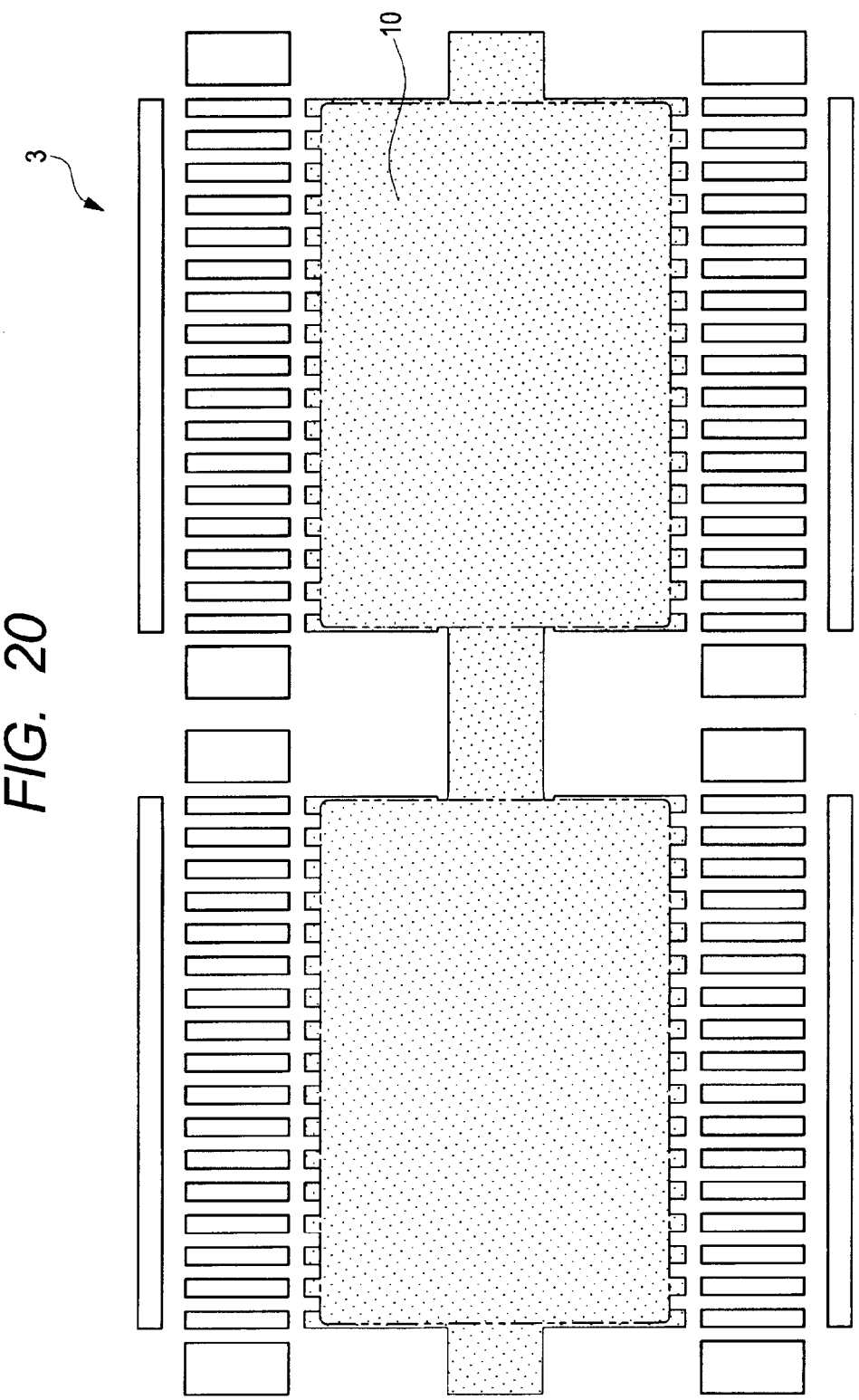
FIG. 20 is a plan view illustrating an example of the structure obtained when resin filling is completed in molding (through molding) in the assembly of the semiconductor device in FIG. 1.
Figure 21:
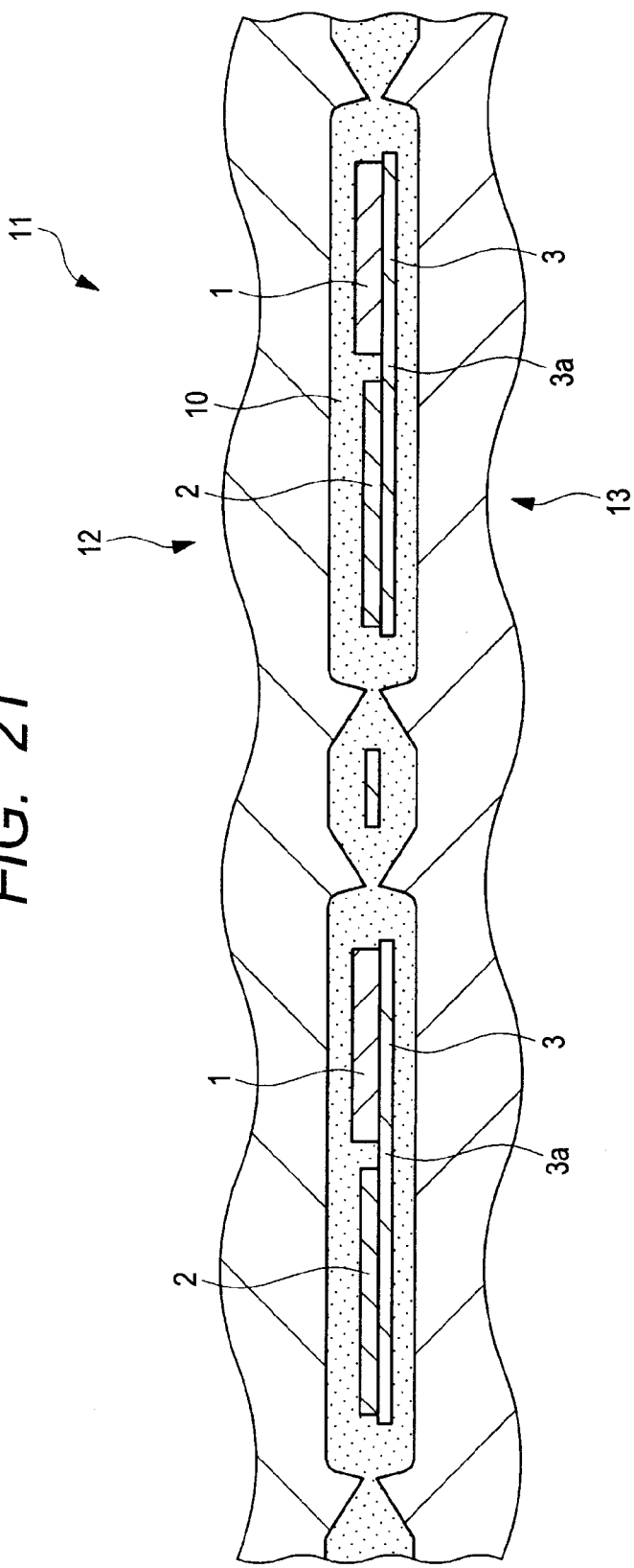
FIG. 21 is a partial sectional view illustrating an example of the structure obtained when resin filling is completed illustrated in FIG. 20.

FIG. 6 is a manufacturing flowchart illustrating an example of an assembling procedure for the semiconductor device in FIG. 1; FIG. 7 is an enlarged partial plan view illustrating an example of the structure of a lead frame used in the assembly of the semiconductor device in FIG. 1; FIG. 8 is an enlarged partial plan view illustrating an example of the structure obtained after first die bonding in the assembly of the semiconductor device in FIG. 1; and FIG. 9 is an enlarged partial plan view illustrating an example of the structure obtained after second die bonding in the assembly of the semiconductor device in FIG. 1. FIG. 10 is partial sectional views illustrating an example of procedures for joining chips together via a wire in wire bonding in the assembly of the semiconductor device in FIG. 1; FIG. 11 is partial sectional views illustrating an example of procedures for joining the chips together via the wire in wire bonding in the assembly of the semiconductor device in FIG. 1; and FIG. 12 is an enlarged partial plan view illustrating an example of the structure obtained after wire bonding in the assembly of the semiconductor device in FIG. 1. FIG. 13 a partial sectional view illustrating an example of the structure obtained when dies are clamped in molding in the assembly of the semiconductor device in FIG. 1; FIG. 14 is a plan view illustrating an example of the state of resin filling during molding in the assembly of the semiconductor device in FIG. 1; FIG. 15 is a partial sectional view illustrating an example of the state of resin filling illustrated in FIG. 14; FIG. 16 is a plan view illustrating an example of the state of resin filling during molding in the assembly of the semiconductor device in FIG. 1; and FIG. 17 is a partial sectional view illustrating an example of the state of resin filling illustrated in FIG. 16. FIG. 18 is a plan view illustrating an example of the state of resin filling during molding in the assembly of the semiconductor device in FIG. 1; FIG. 19 is a partial sectional view illustrating an example of the state of resin filling illustrated in FIG. 18; FIG. 20 is a plan view illustrating an example of the structure obtained when resin filling is completed in molding in the assembly of the semiconductor device in FIG. 1; and FIG. 21 is a partial sectional view illustrating an example of the structure obtained when resin filling is completed illustrated in FIG. 20.

First, such a lead frame 3 as illustrated in FIG. 7 is provided. In the description of this embodiment, a matrix frame in which multiple device areas 3*g* are formed in a matrix configuration will be taken as an example of the lead frame 3.

In each device area 3*g*, the following are formed: a die pad 3*a* whose planar shape is formed of a rectangle, one of quadrangles, having a pair of first sides 3*aa*, 3*ab* and a pair of second sides 3*ac*, 3*ad* intersecting with the first sides 3*aa*, 3*ab*; multiple inner leads 3*b* and outer leads 3*c* arranged along one first side 3*aa* of the two first sides 3*aa*, 3*ab* of the die pad 3*a* in the plan view; multiple inner leads 3*b* and outer leads 3*c* arranged along the other first side 3*ab* of the two first sides 3*aa*, 3*ab* of the die pad 3*a* in the plan view; and four suspending leads 3*d* connecting to the second sides 3*ac*, 3*ad* of the die pad 3*a*.

In the SOP 6 in this embodiment, an aggregate of the inner leads 3*b* and outer leads 3*c* arranged along the first side 3*aa* of the die pad 3*a* is taken as the first lead group 3*ba*; and an aggregate of the inner leads 3*b* and outer leads 3*c* arranged along the first side 3*ab* of the die pad 3*a* is taken as the second lead group 3*bb*.

In each device area 3*g*, the tips of each outer lead 3*c* and each suspending lead 3*d* are supported by a frame portion 3*h* such as an inner frame and an outer frame. Between outer leads 3*c* adjoining to each other, a tie bar 3*f* is formed for the prevention of outflow of molding resin.

In the chip placement surface of each rectangular (quadrangular) die pad 3*a*, the following are formed: the first area 3*ae* for placing an MCU chip 1; and the second area 3*af* for placing an AFE chip 2 positioned next to the first area Sae in the plan view. In addition, the notch 3*e* as a cutout portion is formed in the first sides 3*aa*, 3*ab* between the first area Sae and the second area 3*af*.

The planar shape of the die pad 3*a* in this embodiment is quadrangular, more precisely, rectangular. However, it is not limited to this and it may be square, circular, or the like as long as the MCU chip 1 and the AFE chip 2 can be mounted with a plane configuration. In cases where the planar shape of the die pad 3*a* is, for example, circular, the following are formed in each device area 3*g*: a first lead group 3*ba* as an aggregate of the multiple inner leads 3*b* and outer leads 3*c* on one side; a second lead group 3*bb* as an aggregate of the multiple inner leads 3*b* and outer leads 3*c* on the opposite side to the first lead group 3*ba*; a die pad 3*a* arranged between the first lead group 3*ba* and the second lead group 3*bb* in the plan view; and multiple (four) suspending leads 3*d* supporting the die pad 3*a*, positioned between the first lead group 3*ba* and the second lead group 3*bb* in the plan view.

Subsequently, individual semiconductor chips, that is, the MCU chip 1 and the AFE chip 2 are provided. Specifically, the non-defective MCU chip 1 is acquired by the dicing of Step S1 shown in FIG. 6 and the non-defective AFE chip 2 is acquired by the dicing of Step S2.

Thereafter, first die bonding of Step S3-1 and second die bonding of Step S3-2 are carried out.

At the die bonding steps, a collet for sucking is used to suck (hold) each semiconductor chip and die bonding is carried out. First, the notches $3e$ as the cutout portions formed in the first sides $3aa$, $3ab$ of the die pad $3a$ are recognized to discriminate the first area Sae and the second area $3af$ from each other.

After this discrimination, for example, paste die bond material is applied to the first area Sae and the second area $3af$ of the die pad $3a$ and the semiconductor chips are mounted thereover. A film-like adhesive (DAF) may be used as the die bond material.

In the first die bonding, the thicker MCU chip 1 is sucked and held using, for example, a rubber collet and it is mounted over the first area Sae in FIG. 7. Thus the MCU chip 1 is mounted over the die pad $3a$ first as illustrated in FIG. 8. In the second die bonding, thereafter, the thinner AFE chip 2 is similarly sucked and held by the rubber collet and mounted over the second area $3af$ in FIG. 7. Thus the placement of the AFE chip 2 is completed as illustrated in FIG. 9.

When a rubber collet is used, the area in proximity to the center of the main surface of each semiconductor chip is sucked and held.

However, the sucking collet need not be a rubber collet. Instead, for example, an inverted pyramidal collet that holds the peripheral portion of each semiconductor chip may be used. When the inverted pyramidal collet is used, the thinner AFE chip 2 is die-bonded first and then the thicker MCU chip 1 is die-bonded.

The reason for this is as described below. The inverted pyramidal collet holds the peripheral portion of each semiconductor chip. Therefore, if a thicker chip is die-bonded first, the inverted pyramidal collet hits the thicker chip when a thinner chip is die-bonded. To prevent this problem, the thinner chip is die-bonded first.

After the completion of die bonding, the wire bonding as Step S4 in FIG. 6 is carried out.

At the wire bonding step, bonding pads and inner leads are respectively electrically connected with each other via multiple external wires $5a$ as follows: of the bonding pads $1c$ of the MCU chip 1, the external bonding pads $1ca$ and the inner leads $3b$ corresponding thereto in the first lead group $3ba$ and the second lead group $3bb$; and of the bonding pads $2c$ of the AFE chip 2, the external bonding pads $2ca$ and the inner leads $3b$ corresponding thereto in the first lead group $3ba$ and the second lead group $3bb$. Further, the following bonding pads are respectively electrically connected with each other via multiple internal wires $5b$: the internal bonding pads $1cb$ of the bonding pads $1c$ of the MCU chip 1 and the internal bonding pads $2cb$ of the bonding pads $2c$ of the AFE chip 2.

In the electrical connection between the internal bonding pads $1cb$ of the MCU chip 1 and the internal bonding pads $2cb$ of the AFE chip 2, it is desirable to take the following measure. That is, in wire bonding between the chips, the MCU chip 1 and the AFE chip 2, it is desirable to take the following measure: when wire bonding is carried out, the side of the thicker MCU chip 1 is taken as 1st bond (first bond) side and the side of the thinner AFE chip 2 is taken as 2nd bond (second bond) side.

The reason for this is as described below. In wire bonding between chips, in general, the loop shape of each wire loop can be more easily formed when the wire is drawn down from the side of a chip with a narrower pad pitch to the side of a chip with a wider pad pitch. In the wire bonding between the MCU chip 1 and the AFE chip 2, therefore, the MCU chip 1 narrower in pad pitch and thicker in chip thickness is taken as the 1st bond side.

Description will be given to an example of procedures for wire bonding between chips with reference to FIG. 10.

First, the following processing is carried out on the MCU chip 1 and the AFE chip 2 mounted over the die pad $3a$ as shown in BEFORE WIRE BONDING of Step S4-1 in FIG. 10: as shown in BUMP FORMATION of Step S4-2, ball bonding is carried out on a bonding pad $2c$ of the thinner AFE chip 2 by a capillary 9 to form a bump electrode $2i$. The bump electrode $2i$ is a gold bump formed of, for example, a gold wire.

As shown in 1ST SIDE BONDING of Step S4-3, thereafter, the capillary 9 is positioned over a bonding pad $1c$ of the MCU chip 1. Then a wire 5 is bonded to the bonding pad $1c$ by the capillary 9 to carry out first bonding.

As shown in LOOP FORMATION of Step S4-4 in FIG. 11, thereafter, the capillary 9 is pulled up above the bonding pad $1c$ of the MCU chip 1. Further, the capillary 9 is gently moved down toward the bonding pad $2c$ of the AFE chip 2 to loop the wire 5.

As shown in 2ND SIDE BONDING of Step S4-5, thereafter, the capillary 9 is landed on the bump electrode $2i$ over the bonding pad $2c$ of the AFE chip 2. The wire 5 is thereby bonded to the bump electrode $2i$ to carry out 2nd bonding.

As shown in COMPLETION OF WIRE BONDING of Step S4-6, this completes the wire bonding in which a wire is drawn down from the MCU chip 1 side to the AFE chip 2 side.

The shape of a wire loop can be stabilized by carrying out wire bonding from the higher side (MCU chip 1) to the lower side (AFE chip 2) as mentioned above.

In wire bonding for the SOP 6, the bump electrode $2i$ is formed beforehand on the 2nd bond side (AFE chip 2 side). In other words, therefore, the order of bonding is as described below. First bonding is carried out on the AFE chip 2 side and subsequently, 2nd bonding is carried out on the MCU chip 1. Thereafter, 3rd bonding is carried out on the AFE chip 2 side.

In the SOP 6, as illustrated in FIG. 1, the distance L between the first pad group $1cc$ and the second pad group $1cd$ is larger than the distance M between the third pad group $2cc$ and the fourth pad group $2cd$ (L>M). When wire bonding between chips is completed, therefore, the internal wire $5b$ group made up of the internal wires $5b$ is open toward the second side Sac of the die pad $3a$.

When the pitch of the bonding pads $2c$ of the AFE chip 2 is narrower than the pitch of the bonding pads $1c$ of the MCU chip 1, the following procedure may be taken: the AFE chip 2 side is taken as first bond side and a gold bump is formed beforehand over a bonding pad $1c$ of the MCU chip 1; and then wire bonding in which a wire is drawn up is carried out with the MCU chip 1 side taken as second bond side.

Wire bonding between chips is carried out as mentioned above. Further, the following processing is carried out as illustrated in FIG. 12: each bonding pad $1c$ of the MCU chip 1 and each inner lead $3b$ are joined together via a wire 5 and each bonding pad $2c$ of the AFE chip 2 and each inner lead $3b$ are joined together via a wire 5. The wire bonding step is thereby completed.

Subsequently, molding of Step S5 in FIG. 6 is carried out.

At the molding step in this embodiment, a through gate molding method is used. Detailed description will be given to this through molding. First, such molding dies 11 as illustrated in FIG. 13 are provided. In the molding dies 11 in this embodiment, of the multiple cavities 12a, 13a thereof, cavities adjoining to each other are connected with each other via gates 12b, 13b and air vents 12c, 13c provided between the cavities adjoining to each other. (The cavity is a space portion formed when an upper die 12 and a lower die 13 are mated with each other.) Molding resin 10 is supplied into first cavities 12a, 13a through the gates 12b, 13c connecting to the first cavities 12a, 13a. This molding resin is supplied into second cavities 12a, 13a arranged next to the first cavities 12a, 13a through a flow path provided between the first cavities 12a, 13a and the second cavities 12a, 13a. (In this example, this flow path is made up of gates 12b, 13c and air vents 12c, 13c.) In this embodiment, the gates are formed in each of the upper die 12 and the lower die 13; however, the invention is not limited to this and gates may be formed in only either of them. However, it is desirable to form them in each of the upper die 12 and the lower die 13 in consideration of enhancement of the quality of filling of the resin 10. The air vents may also be formed in only either of the upper die 12 and the lower die 13 similarly to the gates.

Therefore, the molding dies 11 for through molding include a pair of the upper die 12 and the lower die 13. The respective gates 12b, 13b, cavities 12a, 13a, and air vents 12c, 13c are so arranged that they communicate with one another and are positioned on a substantially straight line. Thus the resin 10 can pass through them at a stroke.

In the molding dies 11, the gates 12b (13b) are arranged in the area between the first lead group 3ba and the second lead group 3bb in the lead frame 3 illustrated in FIG. 7. That is, the gates 12b (13b) are arranged in positions in the lead frame 3 corresponding to the short sides (second sides 3ac) of each die pad 3a whose planar shape is rectangular, equivalent to the short sides of the sealing body 4 illustrated in FIG. 1 in the plan view.

The reason for this is as described below. In the SOP 6 and the molding dies 11 in this embodiment, the lead width (width of each inner lead 3b) is 0.2 mm and the lead spacing (spacing between inner leads 3b adjoining to each other) is also 0.2 mm. Meanwhile, the width of each gate 12b (13b) is 1.2 mm. Therefore, since the gate width is larger than the lead spacing, the gate 12b (13b) cannot be arranged between inner leads 3b. That is, the gate 12b (13b) cannot be arranged in a position corresponding to the long sides on which the inner leads 3b of the die pad 3a are arranged and thus it is arranged between two suspending leads 3d on the short sides (second sides 3ac) of the die pad 3a. In other words, each gate 12b (13b) is arranged at a place in the lead frame 3 substantially equivalent to the center of each short side of the sealing body 4 in the plan view.

In the molding dies 11 having the above-mentioned gate arrangement, the lead frame 3 is set over the lower die 13 as illustrated in FIG. 13 so that each die pad 3a of the wire-bonded lead frame 3 comes over a cavity 13a.

As this time, the lead frame 3 is so arranged that the following is implemented with respect to the gate 13b side and the air vent 13c side in the direction of a flow of the resin in each cavity 13a: the thicker MCU chip 1 comes to the gate 13b side and the thinner AFE chip 2 comes to the air vent 13c side.

Thereafter, the upper die 12 and the lower die 13 are clamped together to cover the MCU chip 1 and the AFE chip 2 with a cavity 12a in the upper die 12.

Thereafter, the molding dies 11 are brought into a predetermined high-temperature state and resin 10 is supplied through the gates 12b, 13b in FIG. 13 as illustrated in FIG. 14 and FIG. 15. More specifically, resin 10 is so supplied that it flows from the side of one second side Sac of the two second sides (short sides) 3ac, 3ad of the rectangular die pad 3a illustrated in FIG. 12 to the side of the other second side 3ad.

In other words, resin 10 is so supplied that it flows from the thicker chip (MCU chip 1) side to the thinner chip (AFE chip 2) side.

When the planar shape of each die pad 3a is circular, resin 10 is supplied to the side of one suspending leads 3d located in positions corresponding to the MCU chip 1 to the side of the other suspending leads 3d located in positions corresponding to the AFE chip 2.

The supplied resin 10 flows toward the AFE chip 2 substantially along the rows of leads and gradually fills the areas above the MCU chip 1 and below the back surface of the die pad 3a as illustrated in FIG. 16 and FIG. 17. The resin 10 covering the MCU chip 1 flows between the first pad group 1cc and the second pad group 1cd of the MCU chip 1 illustrated in FIG. 1 and fills the area between the MCU chip 1 and the AFE chip 2.

More specific description will be given. In the SOP 6, as illustrated in FIG. 1, the distance L between the first pad group 1cc and the second pad group 1cd is larger than the distance M between the third pad group 2cc and the fourth pad group 2cd (L>M). As a result, the internal wire 5b group made up of the multiple internal wires 5b is so shaped that the following is implemented: it is open toward the second side Sac side (gate 12b side) of the die pad 3a and is narrowed as it goes toward the second side 3ad side (air vent 12c side).

As a result, of the resin 10 flowing from the gate 12b side to the air vent 12c side, the portion of the resin 10 flowing in proximity to the center over the chip inevitably behaves as follow: it goes through the opening between the first pad group 1cc and the second pad group 1cd and flows into the area between the MCU chip 1 and the AFE chip 2 and fills this area.

This makes it possible to reduce or prevent the formation of a void in the area between the MCU chip 1 and the AFE chip 2.

The resin 10 further flows toward the air vent 12c (13c) along the rows of leads and gradually fills the areas above the AFE chip 2 and below the back surface of the die pad 3a as illustrated in FIG. 18 and the FIG. 19. When filling of the cavities 12a, 13a is thereafter completed, the resin enters the air vents 12c, 13c.

The resin 10 that entered the air vents 12c, 13c further flows into the next cavities 12a, 13a through the gates 12b, 13b of the next cavities 12a, 13a. It similarly fills the cavities 12a, 13a as illustrated in FIG. 20 and FIG. 21.

As a result, the die pad 3a, inner leads 3b, MCU chip 1, AFE chip 2, external wires 5a (5), and internal wires 5b (5) are sealed with the resin 10 in each set of the cavities 12a, 13a.

The SOP 6 in this embodiment has two suspending leads 3d on each side of the rectangular die pad 3a. In the through molding in this embodiment, the gates 12b (13b) of the molding dies 11 are arranged at a place of the lead frame 3 substantially equivalent to the center of a short side of the sealing body 4 in the plan view. That is, the gates 12b (13b) of the molding dies 11 are arranged between two suspending leads 3d. For this reason, it is possible to make the following pressure substantially equal to each other at the time of resin filling: resin pressure (resin filling pressure) applied to the external wires 5a (5) joined with the first lead group 3ba and resin pressure (resin filling pressure) applied to the external wires 5a (5) joined with the second lead group 3bb. This makes it possible to suppress only some wires of the external wires 5a (5) from being extremely inclined. In this embodiment, the suspending leads 3d are arranged on both sides of the gates 12b (13b) provided (in a substantially central part) between the first lead group 3ba and the second lead group 3bb in the plan view. Therefore, the strength for supporting the die pad 3a can be enhanced. That is, while resin 10 is supplied into the cavities (space portions formed when the upper die and the lower die are mated together) 12a, 13a, inclination of the die pad 3a can be suppressed.

Figure 27:
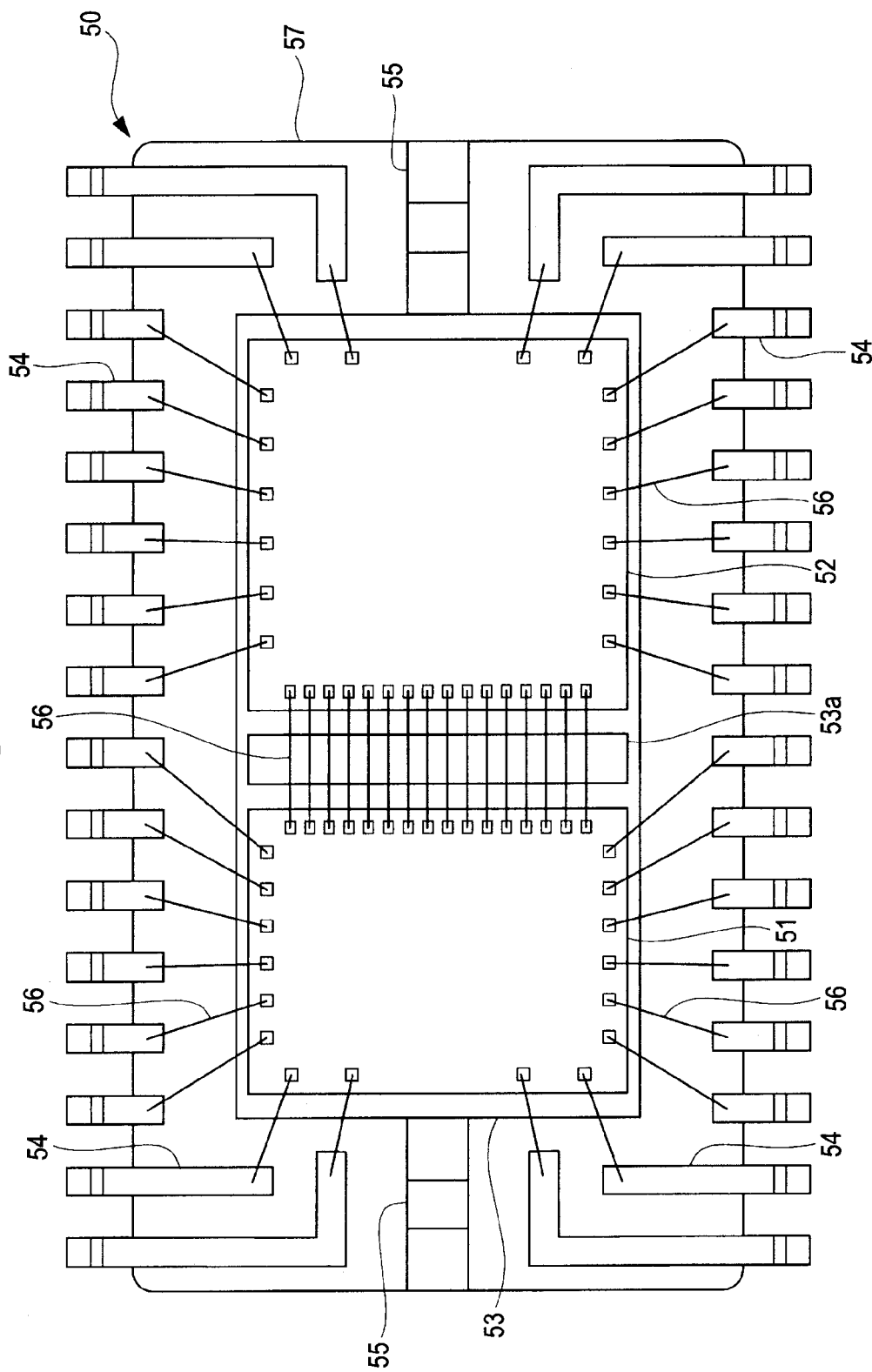

In the semiconductor package 50 in the comparative example in FIG. 27, one thick suspending lead 55 is arranged in the center of one short side of the rectangular die pad 53. As a result, the gate position in molding is shifted from the center of the short side of the die pad 53 and thus variation is prone to occur during resin filling.

In the through molding in this embodiment, meanwhile, resin 10 can be filled with the same resin pressure on the multiple external wires 5a (5); therefore, it is possible to suppress variation during resin filling and reduce a wire sweep In the through molding in this embodiment, the thicker MCU chip 1 side is taken as upstream side and the thinner AFE chip 2 side is taken as downstream side with respect to the flow of resin 10. In general, the flow rate of resin is reduced and the resin is gelated more on the side closer to a gate than on the side farther from the gate with respect to the flow of resin in molding. Therefore, the resin is hardened and this disturbs the flow and makes a void prone to be formed.

In the through molding in this embodiment, the thicker MCU chip 1 is positioned on the upstream side and the thinner AFE chip 2 is positioned on the downstream side with respect to the flow of resin 10 as mentioned above. As a result, the resin 10 is passed through the narrower area above the thicker MCU chip 1 when the flow rate of the resin 10 is high and the resin 10 is passed through the wider area above the thinner AFE chip 2 when the flow of the resin 10 is decelerated. This enhances the fluidity of the flow of resin 10 over the chips. In other words, it is desirable to place the air vents 12c, 13c on the thinner AFE chip 2 side where the distance between the cavity surfaces in the upper die 12 and the cavity surfaces in the lower die 13 can be widened (enlarged). As mentioned above, the distance L between the first pad group 1cc and second pad group 1cd formed in the thicker MCU chip 1 is larger than the following distance: the distance M between the third pad group 2cc and fourth pad group 2cd formed in the AFE chip 2 thinner than the MCU chip 1. In addition, resin is supplied from the MCU chip 1 side to the AFE chip 2 side. As a result, the quality of filling of resin in the area between chips adjoining to each other can be further enhanced.

In addition, the internal wire 5b group arising from wire bonding between chips is so shaped that it is open toward the gate 12b. This makes it possible to enhance ease of entry of the resin 10 with enhanced fluidity into between chips and as a result, it is possible to suppress (reduce) the formation of a void in the area between chips.

In the SOP 6 in this embodiment, the inner leads 3b making up the first lead group 3ba and the second lead group 3bb are bent from the outer leads 3c thereof toward the die pad 3a in the plan view. As a result, it is possible to substantially linearly wire each wire 5 in the direction of extension of each inner lead 3b in the plan view. Further, it is possible to ensure an inflow path for resin 10 and reduce the wire length of each wire 5.

As the result of the reduction of wire length, a wire sweep during molding can be reduced.

When resin is let to flow from a direction equivalent to a short side of a sealing body, in general, a wire sweep is prone to occur. In such a shape that each lead 54 is linearly extended toward a die pad 53 as in the semiconductor package 50 in the comparative example in FIG. 27, the wire length is not reduced and a wire sweep is prone to occur. In the SOP 6 in this embodiment, meanwhile, multiple inner leads 3b are bent toward the die pad 3a as mentioned above and the wire length is reduced. For this reason, a wire sweep can be reduced even when resin 10 is let to flow from a direction equivalent to a short side of the sealing body 4 during molding.

In the SOP 6 in this embodiment, each of the four suspending leads 3d supporting the die pad 3a is bent so that the height position of the die pad 3a is lowered (tab descending processing) as illustrated in FIG. 4. This makes it possible to make the height equal and enhance bondability at the time of wire bonding. Further, it is possible to well balance the flow of resin 10 between above the chips and below the die pad during molding and enhance moldability.

After the completion of molding, marking of Step S6 in FIG. 6 is carried out. At this step, a predetermined mark is put on the upper surface of the sealing body 4 by laser or the like.

Thereafter, the tie bar cutting shown as Step S7 is carried out. At this step, the tie bars 3f between the outer leads 3c adjoining to each other in the molded lead frame 3 illustrated in FIG. 7 are cut and the outer leads 3c adjoining to each other are thereby insulated from each other.

Thereafter, the cutting and forming shown as Step S8 is carried out. At this step, the tips of each outer lead 3c and each suspending lead 3d are cut off from the frame portion 3h and each outer lead 3c is bent and formed into a gull wing shape.

This completes the assembly of the SOP 6 illustrated in FIG. 1. In the SOP 6, as illustrated in FIG. 1 and FIG. 2, the following are protruded from side surfaces 4a of the sealing body 4 formed by the molding step: some outer leads 3c in the first lead group 3ba and some outer leads 3c in the second lead group 3bb. These outer leads 3c are formed in a gull wing shape.

Description will be given to modifications to this embodiment.

Figure 22:
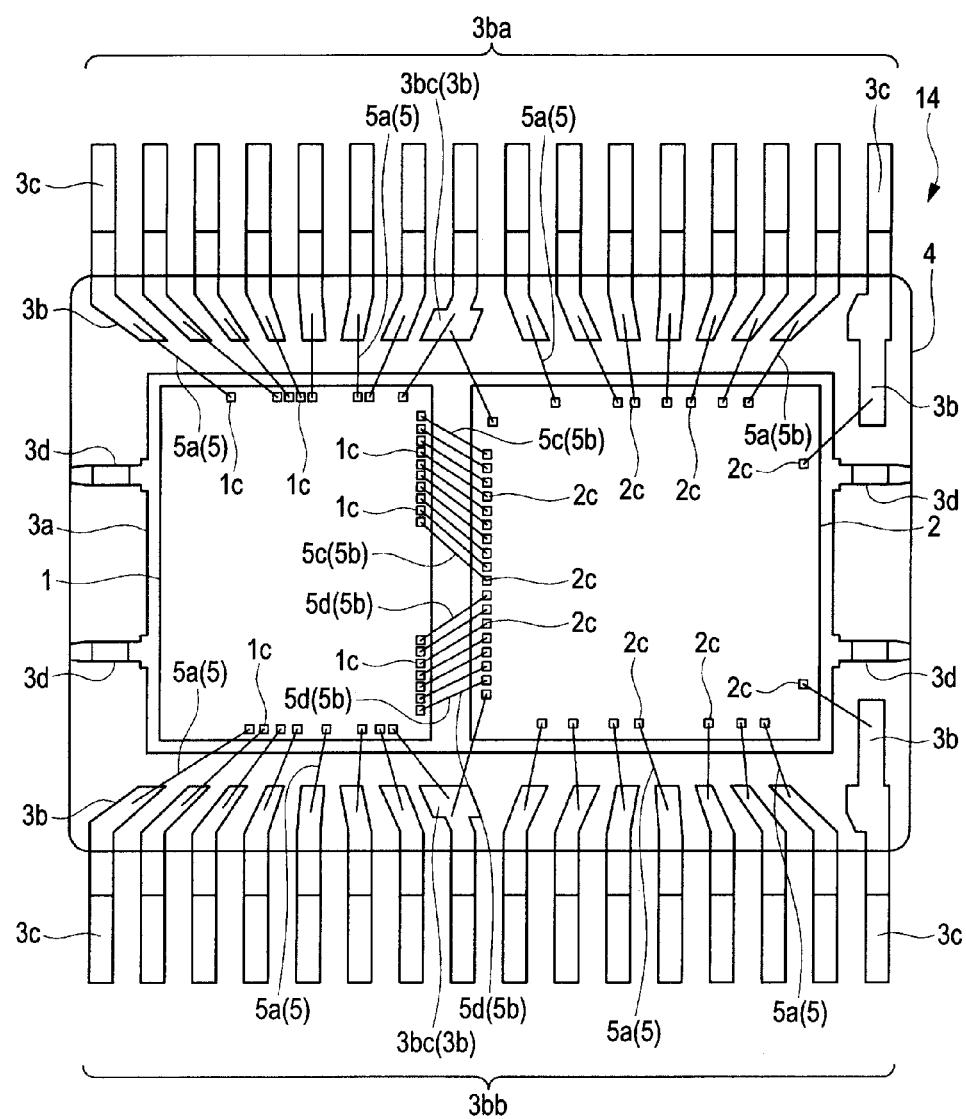
Figure 23:
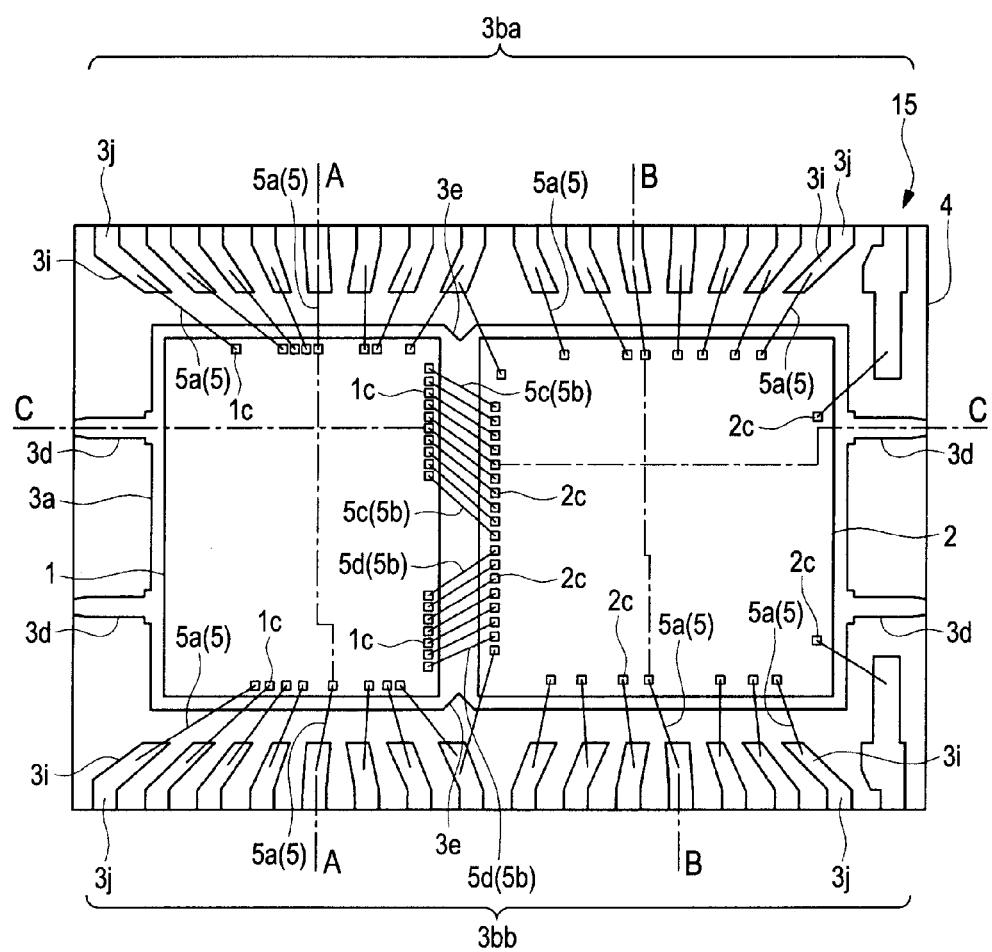
Figure 24:
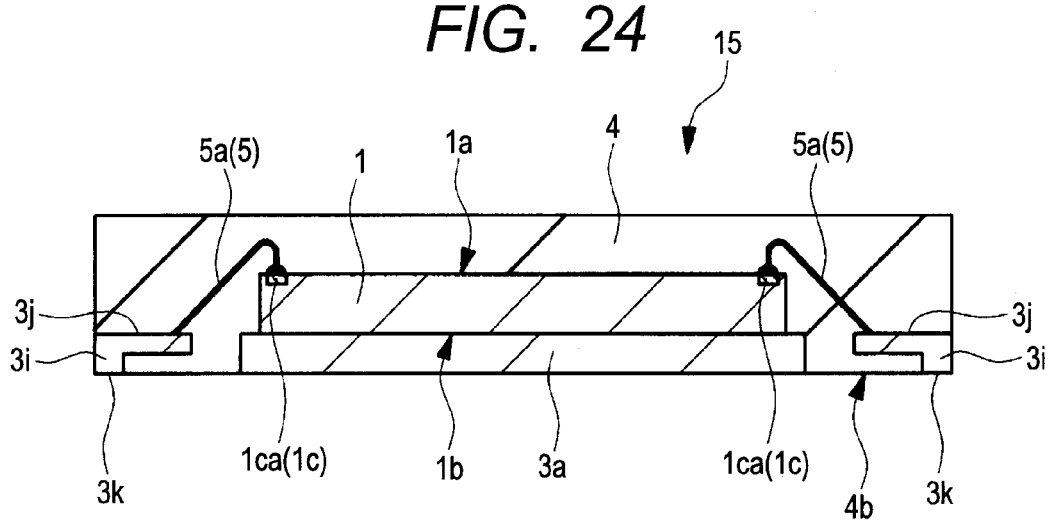
FIG. 24 is a sectional view illustrating an example of the structure obtained by cutting the semiconductor device along line A-A of FIG. 23.
Figure 25:
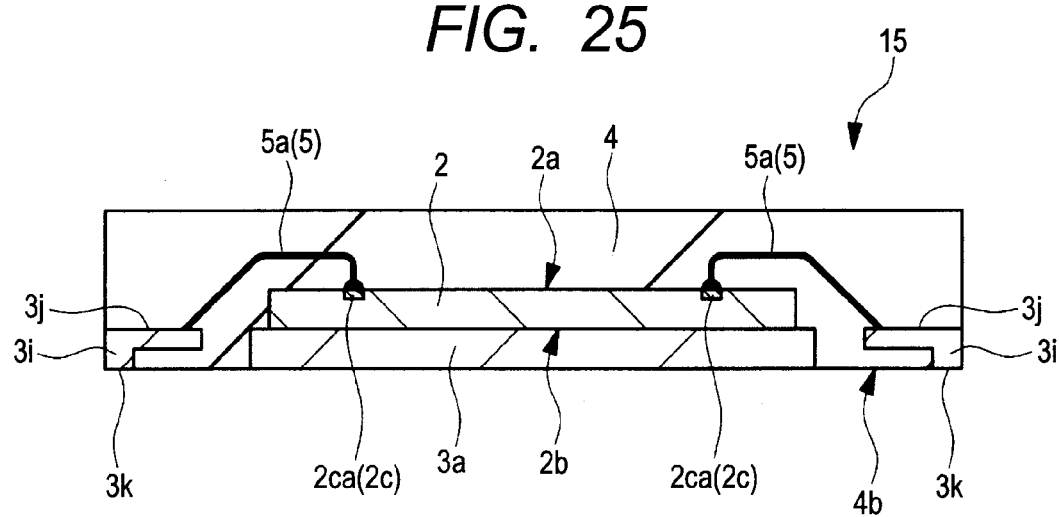
FIG. 25 is a sectional view illustrating an example of the structure obtained by cutting the semiconductor device along line B-B of FIG. 23.
Figure 26:
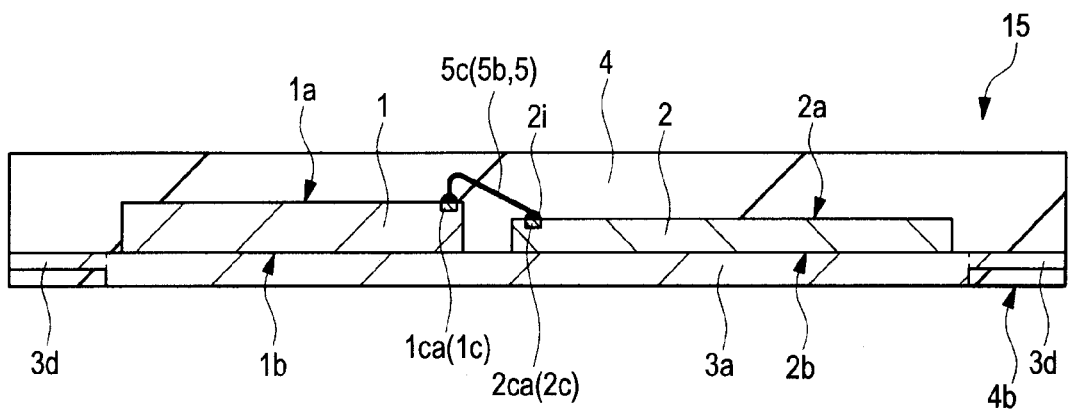
FIG. 26 is a sectional view illustrating an example of the structure obtained by cutting the semiconductor device along line C-C of FIG. 23.

FIG. 22 is a plan view illustrating the structure of a semiconductor device in a first modification to the embodiment of the invention with a sealing body seen through; FIG. 23 is a plan view illustrating the structure of a semiconductor device in a second modification to the embodiment of the invention with a sealing body seen through; FIG. 24 is a sectional view illustrating an example of the structure obtained by cutting the second modification along line A-A of FIG. 23; FIG. 25 is a sectional view illustrating an example of the structure obtained by cutting the second modification along line B-B of FIG. 23; and FIG. 26 is a sectional view illustrating an example of the structure obtained by cutting the second modification along line C-C of FIG. 23.

The semiconductor device in the first modification illustrated in FIG. 22 is an SOP 14 having substantially the same structure as the SOP 6 illustrated in FIG. 1. It is different from the SOP 6 in that: the multiple inner leads 3b in either or both of the first lead group 3ba and the second lead group 3bb include an oddly-shaped lead 3bc different in shape from the other inner leads 3b in the plan view. More specific description will be given. In the above embodiment, the cutout portions (notches 3e) formed in the die pad 3a are used to discriminate (recognize) the placement area for each chip. However, the invention is not limited to this and the oddly-shaped leads 3bc may be used in place of the cutout portions (notches 3e) to discriminate (recognize) the placement area for each chip. The oddly-shaped leads are obtained by making the shape of an inner lead 3b positioned in the area between the MCU chip 1 and the AFE chip 2 or in proximity thereto in the plan view different from the other inner leads 3b. This is done by, for example, varying the thickness or the like thereof. In this modification, the odd shape may be obtained by, for example, widening or narrowing the lead width of the lead.

However, it is desirable to provide a marker (cutout portion, oddly-shaped lead, or the like) for discriminating (recognizing) the placement area for each chip as close to the placement area as possible from the viewpoint of enhancement of the placement accuracy of each chip. In consideration of this respect, use of the cutout portions (notches 3e) formed in the die pad 3a as in the above embodiment is preferable to this modification.

The semiconductor device in the second modification illustrated in FIG. 23 to FIG. 26 is the following SON: an SON (Small Outline Non-leaded package) 15 in which outer portions 3k as parts of multiple leads 3i are exposed from the lower surface 4b of the sealing body 4 as illustrated in FIG. 24 and FIG. 25. The semiconductor device in this embodiment can also be applied to an SON 15.

In the SON 15, each lead 3i is made up of an inner portion 3j buried in the sealing body 4 and an outer portion 3k exposed from the sealing body 4. The outer portions 3k of the leads 3i in the first lead group 3ba and the outer portions 3k of the leads 3i in the second lead group 3bb are exposed from the lower surface 4b of the sealing body 4 formed by the molding step.

In the SON 15, further, the die pad 3a is also exposed in the lower surface 4b of the sealing body 4 as illustrated in FIG. 24 to FIG. 26. That is, the SON 15 is of a tab exposed structure and the height of each lead 3i and the height of the die pad 3a are identical with each other.

The effects obtained by the manufacturing method of the SON 15 in the second modification are identical with the effects obtained by the manufacturing method of the SOP 6 in this embodiment. Therefore, the redundant description thereof will be omitted.

Up to this point, concrete description has been given to the invention made by the present inventors based on an embodiment of the invention. However, the invention is not limited to the above embodiment and can be variously modified without departing from the subject matter thereof, needless to add.

An example will be taken. In the description of the above embodiment, a case where the MCU chip 1 and the AFE chip 2 are mounted in a semiconductor device (SOP 6) has been taken as an example. However, the invention is not limited to this and the semiconductor device may be of, for example, an SIP (System In Package) type in which a memory chip and a microcomputer chip (control chip) for controlling this memory chip are mounted.

The invention can be utilized to assemble an electronic device formed by planarly arranging multiple semiconductor chips.

What is claimed is:

1. A semiconductor device, comprising:
   a base member;
   a first semiconductor chip mounted over the base member, the first semiconductor chip including a plurality of circuits and a plurality of pads; and
   a plurality of wires coupled to the plurality of pads, of the first semiconductor chip, respectively,
   wherein the plurality of circuits include a first circuit, a second circuit, and a third circuit arranged between the first circuit and the second circuit in a plan view,
   wherein, in the plan view, the first, second, and third circuits are arranged along a first side of the first semiconductor chip,
   wherein the plurality of pads include a first pad group comprising a plurality of first pads arranged at a first pitch and coupled with the first circuit which is arranged along the first side of the first semiconductor chip, and a second pad group comprising a plurality of second pads arranged at the first pitch and coupled with the second circuit which is arranged along the first side of the first semiconductor chip,
   wherein, in the plan view, the first pad group and the second pad group are arranged along the first side of the first semiconductor chip,
   wherein, in a plan view, the first pad group and the second pad group are spaced apart from the first, second, and third circuits,
   wherein a distance between the first pad group and the second pad group is greater than the first pitch at which the plurality of first pads and the plurality of second pads are arranged, and
   wherein, in the plan view, a part of the third circuit is located between the first pad group and the second pad group,
   wherein the first circuit is a digital interface circuit,
   wherein the second circuit is an analog interface circuit, and
   wherein the third circuit is a circuit other than the digital interface circuit and the analog interface circuit.

2. The semiconductor device according to claim 1, wherein the third circuit is a signal processing circuit.

3. The semiconductor device according to claim 1,
   wherein a second semiconductor chip is mounted adjacent to the first semiconductor chip on the base member,
   wherein the first side of the first semiconductor chip is a side that is adjacent to the second semiconductor chip,
   wherein, in the plan view, a circuit is not arranged between the first side of the first semiconductor chip and the first pad group,
   wherein, in the plan view, a circuit is not arranged between the first side of the first semiconductor chip and the second pad group, and
   wherein, in the plan view, a pad is not arranged between the first side of the first semiconductor chip and the third circuit.

4. The semiconductor device according to claim 3,
   wherein a degree of integration of the second semiconductor chip is lower than that of the first semiconductor chip.

5. The semiconductor device according to claim 3,
   wherein the second semiconductor chip includes a plurality of third pads arranged at a second pitch, and a plurality of fourth pads arranged at the second pitch,
   wherein, in the plan view, the plurality of third pads and the plurality of fourth pads are arranged along a second side of the second semiconductor chip which is a side that is adjacent to the first semiconductor chip, wherein the plurality of third pads are electrically connected with the plurality of first pads via a plurality of first wires of the plurality of wires, wherein the plurality of fourth pads are electrically connected with the plurality of second pads via a plurality of second wires of the plurality of wires, and wherein a distance between a third pad group comprised of the plurality of third pads and a fourth pad group comprised of the plurality of fourth pads is less than the distance between the first pad group comprised of the plurality of first pads and the second pad group comprised of the plurality of second pads.

6. The semiconductor device according to claim 5, wherein each of the plurality of first pads and each of the plurality of second pads have wires connected to pads disposed on a second semiconductor chip that is mounted on the base member adjacent to the first semiconductor chip.

* * * * *